US006980452B2

(12) United States Patent
Ogura

(10) Patent No.: US 6,980,452 B2

(45) **Date of Patent: *Dec. 27, 2005**

(54) ASSOCIATIVE MEMORY HAVING A MASK FUNCTION FOR USE IN A NETWORK ROUTER

(75) Inventor: Naoyuki Ogura, Yokohama (JP)

(73) Assignee: Terminus Technology Limited, (JP)

(*) Notice: Subject to any disclaimer, the term of this patent is extended or adjusted under 35 U.S.C. 154(b) by 193 days.

This patent is subject to a terminal disclaimer.

(21) Appl. No.: 10/369,822

(22) Filed: Feb. 20, 2003

(65) Prior Publication Data

US 2004/0168021 A1 Aug. 26, 2004

(51) Int. Cl.[7] .............................................. G11C 15/00

(52) U.S. Cl. ............... 365/49; 365/189.07; 365/230.03

(58) Field of Search ............................ 365/49, 189.07, 365/230.03

(56) References Cited

U.S. PATENT DOCUMENTS 6,144,574 A * 11/2000 Kobayashi et al. .... 365/189.07
6,728,124 B1 * 4/2004 Ichiriu et al. ................. 365/49
6,842,358 B2 * 1/2005 Khanna ................. 365/230.03

* cited by examiner

*Primary Examiner*—Huan Hoang
(74) *Attorney, Agent, or Firm*—Cook, Alex, McFarron, Manzo, Cummings & Mehler, Ltd.

(57) ABSTRACT

An associative memory, a router and a network system incorporating an associative memory are disclosed with high speed data transfer speed and low power consumption. An associative memory is constituted of a first circuit means for conducting a primary search operation for each single word of the storage data so as to exclude a single or plural bits of the storage data from the search object with use of an external search data input to the memory when the mask information corresponding to each single word is in a valid state; a second circuit means for selecting a single or plural words as a candidate data; a third circuit means for conducting a logical AND operation to obtain a matched mask logical AND information between each mask information corresponding to the selected candidate data, with assuming the valid state of the mask information as true; and a fourth circuit means for conducting a first logical operation between the matched mask logical AND information and the search data.

18 Claims, 18 Drawing Sheets

ASSOCIATIVE MEMORY HAVING A MASK FUNCTION FOR USE IN A NETWORK ROUTER

BACKGROUND OF THE INVENTION

1. Field of the Invention

The present invention relates to a network system having a router using an associative memory and, in particular, to an associative memory having a mask function.

2. Descrirtion of the Prior Art

The function that calculates the optimum transfer route is indispensable to a conventional network router (hereinafter simply called a router) in a computer network system, as follows.

Referring to FIG. 18, a conventional computer network will be described. A user or subscriber of the network has a user's terminal, such as a computer terminal, for connection to the network. A user's terminal is assigned with a specific network address in accordance with a predetermined rule when it is connected to the network in order to be distinguished from other user's terminals. Herein, the network address is represented by a numeral of a plurality of digits of, for example, first through fourth digits (a, b, c, d). The predetermined rule defines a hierarchical structure of the network address. The predetermined rule defines a hierarchical structure of the network address. For example, the first digit of the numeral represents a nation, such as England, Germany, and Japan. The second digit of the numeral represents a city in the nation, and the third digit of the numeral represents a company name in the city. In the following description, these hierarchical items will be called segments. Referring to FIG. 18, each segment is depicted by a rectangular block. Specifically, the network includes a first segment (SEGMENT1), second segment (SEGMENT2), and a third segment (SEGMENT3) at a highest hierarchical level. The first segment (SEGMENT1) and the second segment (SEGMENT2) include a fourth segment (SEGMENT4) and fifth segment (SEGMENT5), respectively. The fourth segment (SEGMENT4) and the fifth segment (SEGMENT5) include a sixth segment (SEGMENT6) and a seventh segment (SEGMENT7), respectively. A user's terminal (PC) 401-1 exists in the sixth segment. The first segment has a network address (1, *, *, *) in which a first digit alone is specified as "1". The fourth segment subordinate to the first segment has a network address (1, 2, *. *) in which first and second digits "1" and "2" are specified. The sixth segment subordinate to the fourth segment has network address (1, 2, 2, *) in which first through third digits "1", "2", and "2" are specified. Thus, the user's terminal 401-1 in the sixth segment has a specific or unique network address (1, 2, 2, 1). The second segment has a network address (2, *, *, *) in which a first digit alone is specified as "2". The fifth segment subordinate to the second segment has a network address (2, 1, *, *) in which first and second digits "2" and "1" are specified. The seventh segment subordinate to the fifth segment has network address (2, 1, 1, *) in which first through third digits "2", "1", and "1" are specified. A symbol "*" contained in these addresses represents "don't care".

In order to connect or establish communication between a plurality of user's terminals in the network, each segment is provided with a router. As illustrated in FIG. 18, the first segment is provided with the first router 400-1, the second segment is provided with the second router 400-2, the third segment is provided with the third router 400-3, the forth segment is provided with the forth router 400-4, the fifth segment is provided with the fifth router 400-5, the sixth segment is provided with the sixth router 400-6, and the seventh segment is provided with the seventh router 400-7. Each router in the corresponding segment is supplied from any user's terminals or any routers connected to the router with transfer data and a transfer address annexed thereto. With reference to the transfer address and the relationship of connection of network apparatuses, the router calculates an optimum transfer route and transfers the transfer data via the optimum transfer route thus calculated. As illustrated in FIG. 18, each router is connected to any user's terminals or any routers subordinate to the corresponding segment. In addition, the third router 400-3 is connected to the router 400-1, the router 400-4, the router 400-6, the router 400-2, and router 400-7.

The user's terminals are not directly connected by the use of the communication channels but carry out communication by controlling the transfer of communication data by the use of communication control functions of the routers. Thus, communication channels as limited resources are saved.

Next referring to FIG. 19, the third router 400-3 will be described by way of example. Other routers have a similar structure.

The third router 400-3 memorizes, as network address information or data, the network addresses for the segments except the third segment to which the third router 400-3 belongs. Each digit of each network address is represented by a binary number of two bits. Thus, each network address is represented by a bit sequence of eight bits in total. For example, a network address (1, *, *, *) is represented by a bit sequence (01, 00, 00, 00). Hear after, a bit sequence represented above-mentioned representation is called a storage data. Since the symbol "*" represents "don't care" for each of second through fourth digits, it is necessary to indicate that the first and the second bits (01) in the bit sequence (01, 00, 00, 00) alone are valid and the remaining bits (00, 00, 00) are invalid. For this purpose, mask information (or mask data) is combined with the storage data or data. In the illustrated example, the mask information (or mask data) is given by a bit sequence (00, 11, 11, 11). Herein, "0" and "1" represent a mask invalid state and a mask valid state, respectively. In the third router 400-3, the storage data or data and the mask information or data are stored in an associative memory 116, as illustrated in FIG. 19. The first associative memory word 117-1 stores the network address (1, *, *, *) for the segment 1 to which the router 400-1 belongs. The second associative memory word 117-2 stores the network address (2, *, *, *) for the segment 2 to which the router 400-2 belongs. The third associative memory word 117-3 stores the network address (1, 2, 2, *) for the segment 6 to which the router 400-6 belongs. The fourth associative memory word 117-4 stores the network address (1, 2, *, *) for the segment 4 to which the router 400-4 belongs. The fifth associative memory word 117-5 stores the network address (2, 1, 1, *) for the segment 7 to which the router 400-7 belongs. The associative memory 116 has searching (or retrieving) function or mask searching function in addition to write/read functions of writing and reading storage data (namely, the address data) at a designated memory address in the matter similar to an ordinary memory circuit. Specifically, The associative memory 116 has the mask searching function to put the only mask match line 119 corresponding to the storage data with the least number of bits in a mask valid state, in the mask match lines 119 corresponding to one of the storage data coincident with the search data 102 taking the mask information into account, into a valid state, The encoder 402 encodes the mask match lines 119-1 through 119-5 that the associative memory 116 supplies into a memory address signal 403.

The memory 404 stores network addresses of the routers 400 corresponding to the segment network addresses each of which comprises the storage data and the mask information and each of which is stored in each associative memory word 117 of the associative memory 116. In the memory 404, each router network address is memorized in a word corresponding to the associative memory word 117 of the associative memory 116 where a corresponding network address is memorized. For example, the network address **(1, *, *, *) is stored in the first associative memory word 117-1 of the associative memory 116 while the router network address of the router 400-1 (FIG. 18) corresponding thereto is stored in the first word of the memory 404. Similarly, the network address of the router 400-2, the network address of the router 400-6, the network address of the router 400-4, and the network address of the router 400-7 are stored in the second word, the third word, the fourth word, and fifth word of the memory 404, respectively. Supplied with the memory address signal 403 as a read address, the memory 404 produces a memory data signal 405 stored in the word designated by the memory address signal 403**.

A cooling apparatus 414 cools the conventional associative memory 116 with large generation of heat. The cooling apparatus 414 can consist of for example, an air-cooling fan.

Although not illustrated in the figure, each router has a CPU for controlling the above-mentioned operation of the router.

Next, description will be made about a sending data operation in the conventional network controlled by the routers. It is assumed here that the transfer data supplied to the router 400-3 have a destination network address (1, 2, 1, 1). As a result of search by the associative memory 116, **(1, *, *, *) in the first associative memory word 117-1 and (1, 2, *, *) in the fourth associative memory word 117-4 are coincident. Among those coincident network addresses, the network address (1, 2, *, *) in the fourth associative memory word 117-4 has the least number of bits in a mask valid state so that only the mask match line 119-4 corresponding to the fourth associative memory word 117-4 is put into a valid state. Therefore, the encoder 402 produces "4" as the memory address signal 403. In response to the memory address signal 403, the memory 404 produces as the memory data signal 405 the network address for the router 400-4. Consequently, the router 400-3 transfers the input transfer data having the destination network address (1, 2, 1, 1) to the router 300-4. The router 300-4 is responsive to the transfer data and performs the operation similar to that mentioned above. Thus, the transfer data are successively transferred from router to router until the user's terminal at the destination network address (1, 2, 1, 1)** is reached.

Herein, referring to FIG. 14, a typical conventional associative memory will be described. As disclosed in Japanese Unexamined Patent Publication (JA-A) No. 11-073782 (073782/1999) an associative memory 116 comprises a two-input/one-output n-bit selector 128, first through m-th n-bit associative memory words 117, an n-bit latch 21, and a controller 131. Each associative memory word 117-j (where j is and integer variable between 1 and m, both inclusive) comprises first through n-th associative memory cells 118-j-1 through 118-j-n and a latch 123-j. Each of the associative memory words 117-j is connected to the corresponding data word line 106-j and the corresponding mask word line 111-j as input lines and to the corresponding mask match line 119-j and the first through the n-th shortest mask lines 122 as output lines and to the first through the n-th bit lines 103 as data input/output lines.

Each of the associative memory cells 118-j-k (where k is and integer variable between 1 and n, both inclusive) is connected to the corresponding data word line 106-j and the corresponding mask word line 111-j as input lines, and to the corresponding data match line 107-j, the corresponding mask match line 119-j, and the corresponding shortest mask line 122-k as output lines, and to the corresponding bit line 103-k as data input/output line.

Each associative memory cell 118-j-k comprises a data cell 108-j-k, a comparator 113-j-k, a mask cell 112-j-k, a mask comparator 120-j-k, and logical gate 121-j-k. The data cell 108-j-k is for storing "data" bit information at a corresponding bit of storage data supplied from an external source through a bit line 103-k. The comparator 113-j-k is for comparing the "data" bit information memorized in the data cell 108-j-k and "search" bit information 102-k at a corresponding bit of search data supplied from the external source. The mask cell 112-j-k is for storing "mask" bit information of a corresponding bit of mask information supplied from the external source through the bit line 103-k. The mask comparator 120-j-k is for comparing the "mask" bit information memorized in the mask cell 112-j-k and "shortest mask" bit information 127-k at a corresponding bit of shortest mask information produced from the n-bit latch 126.

In this example, a valid state and an invalid state are represented by "1" and "0", respectively, for all of the mask information, the shortest mask lines 122-1 through 122-n, the data match lines 107-1 through 107-m, and the mask match lines 119-1 through 119-m.

The data cell 108 stores as the storage data the state on a corresponding bit line 103 on which the write data is driven when a corresponding data word line 106 is in a valid state, or supplies the storage data stored therein to the corresponding bit line 103 on which the write data is not driven when a corresponding data word line 106 is in a valid state. When the corresponding data word line 106 is in an invalid state, no operation is performed for the corresponding bit line 103. Irrespective of the state of the corresponding data word line 102, the storage data stored therein is supplied to the comparator 113 in the same associative memory cell 118.

The mask cell 112 stores as the mask information the state on a corresponding bit line 103 on which the write data is driven when a corresponding mask word line 111 is in a valid state, or supplies the mask information stored therein to the corresponding bit line 103 on which the write data is not driven when a corresponding mask word line 111 is in a valid state. When the corresponding mask word line 111 is in an invalid state, no operation is performed for the corresponding bit line 103. Irrespective of the state of the corresponding mask word line 111, the mask information stored therein is supplied to the comparator 113 in the same associative memory cell 118.

Prior to the start of the searching operation, the data match line 107 is precharged to a high level or pulled up by a resistor (not shown) to be put into a valid state "1".

The comparator 113 is supplied with the value of the search data on the corresponding bit line 103, the storage data stored in the data cell 108 in the same associative memory cell 118, and the mask information stored in the mask cell 110 in the same associative memory cell 118. When the mask information is in a valid state or when the value on the corresponding bit line 103 and the storage data stored in the data cell 108 are coincident with each other, the data match line 107 is put into an opened state. Otherwise, the comparator 113 puts the data match line 107 into an invalid state "0". Thus, the wired AND logic connection is achieved such that, when all of the comparator 113, n in number, in the associative memory word 117 render the data match line 107 in an opened state, the data match line 107 is put into a valid state "1" and otherwise into an invalid state "0". In other words, upon the searching operation, only when all of the storage data stored in an associative memory word 117 is completely coincident with the bit lines 103-1 through 103-n except those bits excluded from a comparison object by the corresponding mask information, the data match line 107 is put into a valid state "1" and otherwise into an invalid state "0". Alternatively, an ordinary logical gate may be used as far as the similar operation is performed.

The logical gate 121 supplies an invalid state "0" to the shortest mask line 122 when the data match line 107 in the same associative memory word 117 is in a valid state "1" and the mask information stored in the corresponding mask cell 112 is in an invalid state "0". Otherwise, the logical gate 121 puts the shortest mask line 122 into an opened state.

Each of the shortest mask line 122-1 through 122-n is pulled up by a corresponding register 125 to be put into a valid state "1". The shortest mask line 122-k (where k is and integer variable between 1 and n, both inclusive) is connected to all of the corresponding logical gates 121-1-k through 121-m-k, m in number, by a wired AND logic connection. Thus, when all of the first though m-th logical gates 121 connected to the corresponding shortest mask line 122 render the shortest mask line 122 in an opened state, the shortest mask line 122 is put into a valid state "1" and otherwise into an invalid state "0".

The latches 123-1 though 123-m store the states of the data match lines 107-1 through 107-m in the associative memory words 117-1 through 118-m as stored states, respectively, when latch control signal 124 is in valid state. In order to produce the stored states, each latch 123 is connected to the mask match line 119 in the same associative memory word 117 by the wired logic connection. The latches 123-1 through 123-m supply to the corresponding mask match lines 119-1 through 119-m with an invalid state "0" when the stored data have an invalid state "0", respectively, and put the corresponding mask match lines 119-1 through 119-m into an opened state when the stored data have a valid state "1".

Upon completion of the searching operation, only one of the mask match lines 119-1 through 119-m is put into a valid state while the others are put into an invalid state. The mask match line 119 put into a valid state corresponding to one of the storage data coincident with the search data 102 which has the least number of bits excluded from the search object by the mask information. Each of the mask match lines 119-1 through 119-m are pulled up by a resistor (not shown) prior to start of the searching operation or precharged to a high level to be put into a valid state "1".

Each of the mask comparator 120 compares the state of the mask information stored in the corresponding mask cell 112 and the shortest mask information on the corresponding bit line 103. Upon coincidence, the mask comparator 120 puts the corresponding mask match line 119 into an opened state. Upon incoincidence, the mask comparator 120 supplies an invalid state "0" to the corresponding mask match line 119. Thus, the wired AND logic connection is achieved such that, when all of the associative memory cells 118, n in number, and the latch 123 in the same associative memory word 117 render the mask match line 119 in an opened state, the mask match line 119 is put into a valid state "1" and otherwise into an invalid state "0".

In other words, upon the searching operation, only when the mask information stored in the associative memory word 117 is completely coincident with the bit lines 103-1 through 103-n and the state of the data match line 107 stored in the latch 123 is a valid state "1", the mask match line 119 is put into a valid state "1" and otherwise into an invalid state "0".

The n-bit latch 126 stores the states of the shortest mask lines 122-1 through 122-n as stored states when a latch control signal 124 is in a valid state. The n-bit latch 126 supplies the stored states to the latch output lines 127-1 through 127-n.

With reference to the state of a selection signal 129, the two-input/one-output n-bit selector 128 selects, as output data to be supplied to the bit lines 103-1 through 103-n, either the search data 102-1 through 102-n or latch output lines 127-1 through 127-n.

The controller 131 supplies a latch control signal 124 and a selection signal 129 synchronizing with a clock signal 130, in order to control operation of the associative memory 116.

Next referring to FIG. 15, the associative memory cell 118 will be described. Two bit lines **103*a* and 103*b* correspond to each bit line 103 illustrated in FIG. 14. In FIG. 14, each single bit line 103-i collectively represents these bit lines 103*a* and 103*b*. Through the two bit lines 103*a* and 103*b*, writing and reading of the data into and from the memory cell and the input of the search data 102 are carried out. Upon writing the data or the input of the search data 102, the bit line 103*b* is supplied with an inverted value of a value on the bit line 103*a*. The data cell 108 is a typical SRAM (Static Random Access Memory) comprising inverted logical gates (G101 and G102) 301 and 302 with one's input and output terminals connected to the other's output and input terminals, respectively, a MOS (Metal Oxide Semiconductor) transistor (T101) 303 connecting the output terminal of the inverted logical gate (G102) 302 to the bit line 103*a* and rendered conductive when the data word line 106 has a high level, and a MOS transistor (T102) 304 connecting the output terminal of the inverted logical gate (G101) 301 to the bit line 103*b* and rendered conductive when the data word line 106** has the high level.

The mask cell 112 is also a typical SRAM comprising inverted logical gates (G103 and G104) 309 and 310 with one's input and output terminals connected to the other's output and input terminals, respectively, a MOS transistor (T107) 311 connecting the output terminal of the inverted logical gate (G104) 310 to the bit line **103*a* and rendered conductive when the mask word line 111 has ha high level, and a MOS transistor (T108) 312 connecting the output terminal of the inverted logical gate (G103) 309 to the bit line 103*b* and rendered conductive when the mask word line 111** has the high level.

The comparator 113 comprises a MOS transistor (T103) 305, a MOS transistor (T104) 306, a MOS transistor (T105) 307, and a MOS transistor (T106) 308. The MOS transistor (T103) 305 and the MOS transistor (T104) 306 are inserted between the bit lines **103*a* and 103*b* in cascade. The MOS transistor (T103) 305 is rendered conductive when the inverted logical gate (G101) 301 in the data cell 108 produces an output of a high level. The MOS transistor (T104) 306 is rendered conductive when the inverted logical gate (G102) 302 in the data cell 108 produces an output of a high level. The MOS transistor (T105) 307 and the MOS transistor (T106) 308 are connected between a low potential and the data match line 107 in cascade. The MOS transistor (T105) 307 is rendered conductive when a junction or node of the MOS transistor (T103) 305 and the MOS transistor (T104) 306 has a potential of a high level. The MOS transistor (T106) 308 is rendered conductive when the inverted logical gate (G103) 309 in the mask cell 112 produces an output of a high level. When both the bit line 103***a* and the inverted logical gate (G101) 301 produce outputs of a high level or when both the bit line 103*b* and the inverted logical gate (G102) 302 produce outputs of a high level, the junction of the MOS transistor (T103) 305 and the MOS transistor (T104) 306 has a high level to render the MOS transistor (T105) 307 conductive.

Therefore, when the storage data stored in the data cell 108 and the search data 102 on the bit lines 103*a* and 103*b* are different from each other, the MOS transistor (T105) 307 is rendered conductive. The MOS transistor (T106) 308 is put into an opened state and conductive state when the mask information stored in the mask cell 112 is "1" and "0", respectively. The data match line 107 is pulled up to a high potential by the resistor (not shown) or precharged to a high potential prior to the start of the searching operation. This provides the wired AND connection such that, when a plurality of the associative memory cells 118 are connected to the data match line 107 through the MOS transistors (T106) 308, the data match line 107 is given a low level if at least one associative memory cell 118 produces an output of a low level.

When both the MOS transistor (T105) 307 and the MOS transistor (T106) 308 are conductive, the associative memory cell 118 supplied an invalid state "0" to the data match line 107. Otherwise, the data match line 107 is put into an opened state. Specifically, when the mask information is "1", the data match line 107 is put into an opened state. When the mask information is "0", the data match line 107 is put into an opened state and supplied with an invalid state "0" when the search data 102 on the bit lines 103*a* and 103*b* and the storage data stored in the data cell 108 are coincident with each other and different from each other, respectively.

Next, the logical gate 121 and the shortest mask line 122 will be described. The shortest mask line 122 is pulled up by a register 125 (FIG. 14) to be put into a valid state "1" prior to a searching operation. The logical gate 121 comprises MOS transistors (T109 and T110) 313 and 314 connected in cascade between the shortest mask line 122 and a low potential. The MOS transistor (T109) 313 is put into a conductive state and an opened state when a data match line 107 is in a valid state "1" and an invalid state "0", respectively. The MOS transistor (T110) 314 is put into a conductive state and an opened state when an inverted logical gate (G103) 309 in the mask cell 112 produces an output of a high level and a low level, respectively, i.e., when the mask information stored in the mask cell 112 is in an invalid state "0" and a valid state "1", respectively. Thus, the logical gate 121 supplies an invalid state "0" to the shortest mask line 122 when the data match line 107 is in a valid state "1" and the mask information stored in the mask cell 112 is in an invalid state "0". Otherwise, the logical gate 121 puts the shortest mask line 122 into an opened state.

Next, description will proceed to the operation of the mask comparator 120 and the mask match line 119. The mask match line 119 is pulled up to a high potential by a resistor (not shown) or precharged to a high potential prior to the searching operation.

The mask comparator 120 comprises MOS transistors (T111, T112, and T113) 315, 316, and 317. The MOS transistors (T111 and T112) 315 and 316 are connected in cascade between the bit lines 103*a* and 103*b*. The MOS transistor (T111) 315 is put into a conductive state when the inverted logical gate (G103) 309 in the mask cell 112 produces an output of a high level. The MOS transistor (T112) 316 is put into a conductive state when an inverted logical gate (G104) 310 in the mask cell 112 produces an output of a high level. The MOS transistor (T113) 317 is connected between a low potential and the mask match line 119. The MOS transistor (T113) 317 is put into a conductive state when a junction or node of the MOS transistor (T111) 315 and the MOS transistor (T112) 316 has a potential of a high level.

When both the bit line 103*a* and the inverted logical gate (G103) 309 produce outputs of a high level or when both the bit line 103*b* and the inverted logical gate (G104) 310 produce outputs of a high level, the junction of the MOS transistor (T111) 315 and the MOS transistor (T112) 316 has a potential of a high level so that the MOS transistor (T113) 317 is put into a conductive state. Otherwise, the MOS transistor (T113) 317 is put into an opened state.

Therefore, when the mask information stored in the mask cell 112 is different form the search data 102 on the bit lines 103*a* and 103*b*, the MOS transistor (T113) 317 is put into a conductive state to supply an invalid state "0" to the mask match line 119. Upon coincidence, the mask match line 119 is put into an opened state.

Thus, a wired AND connection is achieved such that, when at least one of the associative memory cells 118 connected through the MOS transistor (T113) 317 to the mask match line 119 produces a low level, the mask match line 119 is given a low level and otherwise a high level.

Next referring to FIG. 16, description will be made about the operation when the above-mentioned conventional associative memory 116 is used in calculating the transfer network address in the router 400-3 in FIG. 18. Referring to FIG. 17, this operation will be described by the use of a timing chart.

It is assumed here that the associative memory 116 comprises five words of eight bits. Therefore, the storage data and the mask information stored in each of the associative memory words 117-1 through 117-5 are quite similar to those of the associative memory 116 in FIG. 19. The associative memory 116 memorizes the connection information except the network address (3, *, *, *) of the router 400-3 in FIG. 18. Specifically, the associative memory word 117-1 stores in binary numbers the storage data (01, 00, 00, 00) and the mask information (00, 11, 11, 11) to implement (1, *, *, *). Likewise, the associative memory words 117-2, 117-3, 117-4, and 117-5 stores (2, *, *, *), (1, 2, 2, *), (1, 2, *, *), and (2, 1, 1, *), respectively. Description will proceed to the searching operation by supplying as the search data 102 the network address (1, 2, 2, 1), in quadridecimal numbers, of the user's terminal (PC) 401-1 in FIG. 18.

At first, all of the data match lines 107-1 through 107-8 are precharged to a high level ("1") to be put into a valid state "1" at the timing (1) in FIG. 17.

Next, the two-input/one-output 8-bit selector 128 is responsive to the selection signal 129 which the controller 131 supplies, and selects the search data 102 to deliver the search data 102 to the bit lines 103-1 through 103-8 at the timing (2) in FIG. 17. Therefore, the quadridecimal notations (1, *, *, *), (1, 2, 2, *) and (1, 2, *, *) respectively stored in the associative memory words 117-1, 117-3 and 117-4 in the associative memory 116 are coincident with the search data 102 on the bit lines 103. Accordingly, the data match lines 107-1, 107-3 and 107-4 are put into a valid state "1" while the remaining data match lines 107-2, and 107-5 are put into an invalid state "0".

Herein, the shortest mask line 122-1 produces the logical product "0" of the mask bit information "0", "0" and "0" in the associative memory words 117-1, 117-3 and 117-4 at bit positions corresponding to the shortest mask line 122-1. The shortest mask line 122-2 produces the logical product "0" of the mask information "0", "0" and "0" in the associative memory words 117-1, 117-3 and 117-4 at bit positions corresponding to the shortest mask line 122-2. Likewise, the shortest mask lines 122-3, 122-4, 122-5, 122-6, 122-7, and 122-8 produce the logical product "0" of "1", "0" and "0", the logical product "0" of "1", "0" and "0", the logical product "0" of "1", "0" and "1", the logical product "0" of "1", "0" and "1", the logical product "1" of "1", "1" and "1", and the logical product "1" of "1", "1" and "1", respectively. As a result, the binary notation "00000011" is delivered to the shortest mask lines 122-1 through 122-8.

In this state, the latch control signal 124 that the controller 131 supplies is put into valid state. The latches 123-1 through 123-5 store the states of the corresponding match lines 107-1 through 107-5, respectively, while the n-bit latch 126 stores the states of the shortest mask lines 122-1 through 122-8. Accordingly, the latches 123-1, 123-2, 123-3, 123-4, and 123-5 store "1", "0", "1", "1", and "0", respectively, while the n-bit latch 126 stores the binary notation "00000011". The n-bit latch 126 delivers the stored state "00000011" to the latch output line 127-1 through 127-8.

Next, at the timing (3) in FIG. 17, all of the mask match lines 119-1 through 119-8 are precharged to a high level to be put into a valid state "1".

At the timing (4) in FIG. 17, in response to the selection signal 129 which the controller 131 supplies, the two-input/one-output 8-bit selector 128 selects the latch output line 127 and supplies the information "00000011" on the latch output line 127 to the corresponding bit lines 103-1 through 103-8. Thereafter, the associative memory 116 starts a second searching operation. In the second searching operation, use is made of the states of the mask match lines 119-1 through 119-8 while the states of the data match line 107-1 through 107-8 are ignored.

The mask information stored in each of the associative memory words 117-3 and 117-5 is completely coincident with the states "00000011" on the bit lines 103-1 through 103-8 so that the corresponding mask match lines 119-3 and 119-5 are put into an opened state. Since the mask information stored in any other associative memory words 117-1, 117-2, and 117-4 is not coincident, the corresponding mask match lines 119-1, 119-2, and 119-4 are supplied with an invalid state "0".

The latch 123-1 puts the corresponding mask match line 119-1 into an opened state because the stored state is "1". The latch 123-2 delivers the stored state "0" to the corresponding mask match line 119-2. The latch 123-3 puts the corresponding mask match line 119-3 into an opened state because the stored state is "1". The latch 123-4 puts the corresponding mask match line 119-4 into an opened state because the stored state is "1". The latch 123-5 delivers the stored state "0" to the corresponding mask match line 119-5.

Therefore, the mask match line 119-1 is put into an invalid state "0" because the mask comparators 120-1-1 through 120-1-8 of the associative memory word 117-1 produce "0" although the latch 123-1 is in an opened state. The mask match line 119-2 is put into an invalid state "0" because the mask comparators 120-2-1 through 120-2-8 of the associative memory word 117-2 produce "0" and the latch 123-2 produces "0". The mask match line 119-3 maintains a valid state "1" because the mask comparators 120-3-1 through 120-3-8 of the associative memory word 117-3 are in an opened state and the latch 123-3 is in an opened state. The mask match line 119-4 is put into an invalid state "0" because the mask comparators 120-4-1 through 120-4-8 of the associative memory word 117-4 produce "0" although the latch 123-4 is in an opened state. The mask match line 119-5 is put into an invalid state "0" because the mask comparators 120-5-1 through 120-5-8 of the associative memory word 117-5 are in an opened state although the latch 123-5 produces "0".

Consequently, only one of the mask match line 119-1 through 119-5 corresponding to a particular one the associative memory words 117-1 through 117-5 is in a valid state "1" upon completion of the second searching operation at the timing (4). Specifically, the storage data preliminarily stored in the particular associative memory word (117-3 in the illustrated example) is selected in the first search operation as coincident with the search data 102 taking the mask information into account while the mask information preliminarily stored is selected in the second searching operation as coincident with the states of the shortest mask lines 122-1 through 122-8 obtained by the first searching operation at the timing (2). It will therefore be understood that, in the mask match lines 119 corresponding to one of the storage data coincident with the search data 12 taking the mask information into account, the only mask match line 119-3 corresponding to the storage data with the least number of bits in a mask valid state is put into a valid state As described above, the associative memory 116 supplies the comparison result of the search data 102 and the storage data stored in the first through m-th associative memory words 117 to the first through the data match lines 107 upon the first searching operation, and supplies the comparison result of the value on the latch output line 127 and the mask information stored in the first through m-th associative memory words 117 to the first through the match lines 107 upon the second searching operation. For this purpose, the associative memory cell 118, n in number, in the each of the first through m-th associative memory word 117 the requires two kinds of comparing means, comparators 113 comparing the storage data and mask comparators 120 comparing the mask information.

Herein, when it is assumed that each of the inverted logical gates comprises two MOS transistors, the associative memory cell 118 comprises 18 MOS transistors as readily understood from FIG. 15. Since both the data cell 108 and the mask cell 112 are typical SRAMs, the circuit area of each transistor comprising these is similar to the circuit area of the minimum MOS transistor, in general.

However, each of the data match lines 107-1 through 107-m is connected to the first through n-th comparator 113 in the corresponding associative memory word 117 by a wired AND logic connection so that the data match line 107 requires enough length to achieve this connection. Thus, the parasitic capacitance of each of the data match lines 107-1 through 107-m is very large so that the MOS transistors that composes the comparator 10 and the logical gate 11 require large circuit area in order to drive the large parasitic capacitances of each of the data match lines 107. For example, in case of 0.25 micron meter rule manufacturing process, the wiring length is required about 1 millimeter in order to connect to 64 comparators, so that the parasitic capacitance of each data match line 107 is about 0.3 pF. Accordingly, the size of each transistor that drives above-mentioned capacitance requires about 10 to 30 times as large as the size of the minimum transistor for the manufacturing process. Likewise, each of the mask match lines 119-1 through 119-m is connected to the first through n-th mask comparator 120 by a wired AND logic connection so that the size of each transistor that composes the logical gate 121 requires about 10 to 30 times as large as the size of the minimum transistor for the manufacturing process. In the meanwhile, each of the shortest mask lines 122-1 through 122-n is connected to the first through m-th logical gates 121 by a wired AND logic connection so that the shortest mask lines 122 requires enough length to achieve this connection. Thus, the size of each transistor that composes the logical gate 121 requires about 10 to 30 times as large as the size of the minimum transistor for the manufacturing process.

Herein, it is assumed that the circuit area of each MOS transistor that composes the comparator 113, the mask comparator 120, and the logical gate 121 is 10 times as the circuit area of the minimum MOS transistor and the circuit area of a typical SRAM is 6 times as the circuit area of the minimum MOS transistor. Accordingly, as readily understood from FIG. 15, the circuit area of the associative memory cell 118 is 102 times as the circuit area of the minimum MOS transistor. In other words, the conventional associative memory 116 has only 1/17 of the storage capacity in comparison with a SRAM that has the same chip area.

As described above, the data match lines 107-1 through 107-m are supplied with the comparison result upon the first searching operation, and the mask match lines 119-1 through 119-m are supplied with the comparison result upon the second searching operation. Therefore, the conventional associative memory requires maintaining the comparison result of the first searching operation until the start of the second searching operation. Herein, if the associative memory 116 comprises the first through 32768th 64-bit associative memory words and the latch 123 comprises 10 MOS transistors, about 330,000 transistors are required in order to compose the latch 123, 32,768 in number. In other words, irrespective of number of bits of the storage data, the chip area of the conventional associative memory increases by a circuit area of the latch 123-1 through 123-m, m in number.

In the meanwhile, each of the data match lines 107-1 through 107-m, m in number, and the mask match lines 119-1 through 119-m, m in number, except one mask match line that is put into a valid state upon completion of the searching operation, discharge the charge that is precharged thereto through the corresponding MOS transistor for every searching operation. Therefore, if the associative memory comprises the first through 32768th 64-bit associative memory words, the parasitic capacitance corresponding to 65,535 lines requires being precharged, as given by $32,768\times2-1=65,535$. The parasitic capacitance of the shortest mask lines 122-1 through 122-n is negligible because the shortest mask lines 122-1 through 122-n are n in number. In other words, power consumption of the conventional associative memory mainly comprises the power that is consumed when the data match lines 107 and mask match lines 119 are precharged for every searching operation. Herein, it is assumed that each parasitic capacitance of the data match line 107 and mask match line 119 is 0.3 pF, and that the supplied voltage is 2.5V, and that the period of the clock signal 130 is 20 ns. Accordingly, as described above, in case of 0.25 micron meter rule manufacturing process, the power consumption of the whole chip is very large as given by $(0.3\ \text{pF}\times2.5\text{V})\times2.5\text{V}/20\ \text{ns}\times65,535=6.1\ \text{W}$. Therefore, since each of the data match lines 107-1 through 107-m, m in number, and the mask match lines 119-1 through 119-m, m in number, except one mask match line that is put into a valid state upon completion of the searching operation, requires being precharged to be put into a valid state Prior to the start of every searching operation, the conventional associative memory has very large power consumption.

As described above, the conventional router requires a plurality of the associative memory 116 since the storage capacity of the associative memory 116 is small. Therefore the conventional router generates a large amount of heat so that the cooling apparatus 414 is requires as illustrated in FIG. 19. Further, the data transfer rate decreases since the conventional router requires comparing to the results of the searching operation supplied from a plurality of the associative memory in order to calculate the final result of the searching operation.

SUMMARY OF THE INVENTION

It is therefore an object of this invention to provide an associative memory which produces the signal identifying, among the storage data coincident with the search data, particular storage data corresponding to the mask information with the least number of bits in a valid state, and has large storage capacity per unit of chip area It is another object of this invention to provide an associative memory that which produces the signal identifying, among the storage data coincident with the search data, particular storage data corresponding to the mask information with the least number of bits in a valid state, and has small power consumption per word.

It is still another object of this invention to provide a router which does not require a cooling apparatus.

It is still another object of this invention to provide a network system which is capable of transferring data at a high speed.

Herein, according to this invention, there is provided an associative memory storing plural pairs of mask information and storage data, said associative memory comprising a means for carrying out, when plural storage data are selected as a selected storage data in a searching operation, a logical operation of the mask information corresponding to said plural selected storage data.

Specifically, the mask data are defined by logical value of "1" and "0". When a plurality of match lines is put into a valid state, logical operation, for example logical multiple, is carried out bit by bit for those mask information stored in associative memory words connected to the valid-state match lines As a result, among the mask information corresponding to the coincident storage data, the mask information with a least number of bits in a mask valid state for the mask information (the shortest mask information) is obtained.

Among the mask information stored in plural memory words with match line in a valid state, a particular one having a bit sequence identical with the above-mentioned particular mask information is retrieved. It is thus possible to select a particular one of the selected storage data which corresponds to the particular mask information having the least number of bits in a valid sate for the mask information.

According to a first aspect of this invention, there is provided an associative memory which stores a mask information therein corresponding to each single or each plural words of storage data, the mask information enabling to set in accordance with a valid state or an invalid state whether or not each single bit or each plural bits of the storage data should be excluded from a search object; said associative memory comprising: i) a first circuit means for conducting a primary search operation for each single word of the storage data so as to exclude a single or plural bits of the storage data from the search object with use of an external search data input to the memory when the mask information corresponding to each single word is in a valid state; ii) a second circuit means for selecting a single or plural words as a candidate data; iii) a third circuit means for conducting a logical AND operation to obtain a matched mask logical AND information between each mask information corresponding to the selected candidate data, with assuming the valid state of the mask information as true; and iv) a fourth circuit means for conducting a first logical operation between the matched mask logical AND information and the search data.

According to a second aspect of this invention, an associative memory is characterized by further comprising a fifth circuit means for storing a particular bit pattern as the storage data in the single bit or the plural bits excluded in the primary search operation in accordance with a mask information corresponding thereto, and a sixth circuit means for conducting a secondary search operation to select a word in which the storage data matches with a result of the first logical operation.

According to a third aspect of this invention, an associative memory is characterized by further comprising a seventh circuit means for conducting a secondary search operation to convert the result of the first logical operation into the search data thereby selecting a word which matches the result of the first logical operation, with regarding the single bit or the plural bits of the storage data excluded from the search object in the primary search operation as the particular bit pattern.

According to a fourth aspect of this invention, an associative memory is characterized in that each bit of the particular bit pattern is constructed in an invalid state for the storage data.

According to a fifth aspect of this invention, an associative memory is characterized in that the first logical operation is conducted in a manner that information of the same bit position of the search data is set as the result of the logical operation at the same bit position when a bit for the matched mask logical AND information is an invalid. state for the mask information or that an invalid state for the storage data is set as the result of the logical operation at the same bit position when a bit for the matched mask logical AND information is a valid state for the mask information.

According to a sixth aspect of this invention, there is provided an associative memory which stores a mask information therein corresponding to each single or each plural words of storage data, the mask information enabling to set in accordance with a valid state or an invalid state whether or not each single bit or each plural bits of the storage data should be excluded from a search object; said associative memory comprising a first associative sub-memory and a second associative sub-memory, said first associative sub-memory comprising: i) a first circuit means for conducting a primary search operation for each single word of the storage data so as to exclude a single or plural bits of the storage data from the search object with use of an external search data input to the memory when the mask information corresponding to each single word is in a valid state; ii) a second circuit means for selecting a single or plural words as a candidate data; iii) a third circuit means for conducting a logical AND operation to obtain a matched mask logical AND information between each mask information corresponding to the selected candidate data, with assuming the valid state of the mask information as true; and iv) a fourth circuit means for conducting a first logical operation between the matched mask logical AND information and the search data; said second associative sub-memory storing the same storage data in each word corresponding to addresses of each word of said first associative sub-memory; wherein the primary search operation is performed in a manner that the external search data is input to said first associative sub-memory to obtain a result of logical operation and a secondary search operation is performed in a manner that the result of logical operation is input to said second associative sub-memory as a search data to select a word in which a bit information of the storage data matches with the result of logical operation.

According to a seventh aspect of this invention, an associative memory is characterized by further comprising one or more memory means for storing the result of logical operation output from said first associative sub-memory so that the primary search operation and the secondary search operation can be performed in parallel with use of an output of the one or more memory means.

According to an eighth aspect of this invention, there is provided an associative memory which stores a mask information therein corresponding to each single or each plural words of storage data, the mask information enabling to set in accordance with a valid state or an invalid state whether or not each single bit or each plural bits of the storage data should be excluded from a search object; said associative memory comprising a first searching means and a second searching means, said first searching means comprising: i) a first circuit means for conducting a primary search operation for each single word of the storage data so as to exclude a single or plural bits of the storage data from the search object with use of an external search data input to the memory when the mask information corresponding to each single word is in a valid state; ii) a second circuit means for generating an intermediate information in a manner to select a mask information having a minimum bit number in a storage information set to be excluded from the search object among all the mask information which corresponds to the storage data matching with the search data when one or more storage data match with the search data; and iii) a third circuit means for outputting to an arithmetic result output line the result of a first logical operation between the intermediate information and a search information; said second searching means outputting to the arithmetic result output line a signal to identify the matched storage data.

According to a ninth aspect of this invention, an associative memory is characterized in that said first searching means stores a particular bit pattern as the storage data in the single bit or the plural bits excluded in the primary search operation in accordance with a mask information corresponding thereto.

According to a tenth aspect of this invention, an associative memory is characterized in that said second searching means conducts a search with regarding the storage data in the single bit or the plural bits excluded in the primary search operation in accordance with a mask information corresponding thereto as a particular bit pattern, and selects a word in which the storage data matches with data of the arithmetic result output line.

According to a eleventh aspect of this invention, an associative memory is characterized in that each bit of the particular bit pattern is constructed in an invalid state for the storage data.

According to a twelfth aspect of this invention, an associative memory is characterized in that said first searching means comprises an arithmetic result output circuit having a match line revealing a valid state when the search data matches with the storage data accompanying the mask information for each word of the storage data, means for generating an intermediate information in a manner that when one or more storage data matches with the search data, a logical AND operation is performed for all the mask information corresponding to a matched storage data, with assuming the valid state of the mask information as true, and means for outputting to the same bit position of the arithmetic result output line as a result of operation information of the same bit position of the search data when a bit of the intermediate information is an invalid state or information of invalid state when a bit of intermediate information is a valid state.

According to a thirteenth aspect of this invention, an associative memory is characterized in that said first searching means comprises a first memory means for storing information of the arithmetic result output line; a selecting means for selecting and inputting as input search data either the external search data or an output signal of the first memory means; and a comparing means for outputting to the corresponding match line comparison result in a manner that when the output signal of the first memory means is selected as the search data, comparison is made between the search data and the storage data while invalidating a function for excluding a single bit or plural bits of the storage data when the corresponding mask information is valid, thereby sharing each constituent element between said first and second searching means.

According to a fourteenth aspect of this invention, an associative memory is characterized in that said first searching means comprises a first memory means for storing information of the arithmetic result output line; a selecting means for selecting and inputting as input search data either the external search data or an output signal of the first memory means; and a comparing means for outputting to the corresponding match line comparison result in a manner that when the output signal of the first memory means is selected as the search data, comparison is made between the search data and the storage data while regarding a single bit or plural bits of the storage data when the corresponding mask information is valid as an invalid state for the storage data, thereby sharing each constituent element between said first and second searching means.

According to a fifteenth aspect of this invention, there is provided a router for storing routing information therein having an associative memory which stores a mask information therein corresponding to each single or each plural words of storage data, the mask information enabling to set in accordance with a valid state or an invalid state whether or not each single bit or each plural bits of the storage data should be excluded from a search object; said router comprising: i) a first searching means for outputting to an arithmetic result output line the result of a first logical operation between a matched mask logical AND information and a search data in a manner that a primary search operation for excluding a single bit or plural bits for each word of the storage data corresponding to a mask information from the search object when the mask information is valid is performed wherein a destination network address of input transfer data is selected as the search data, and the matched mask logical AND information is generated in such a manner to conduct a logical AND operation between each mask information corresponding to the storage data which matches with the destination network address with assuming the valid state of the mask information as true; ii) a second searching means for outputting a match signal to identify the routing information having the storage data matching with information of the arithmetic result output line; and iii) means for determining a transfer address of the input transfer data in response to the match signal.

According to a sixteenth aspect of this invention, there is provided a router for storing a plurality of routing information in a routing information table which stores a mask information therein corresponding to each single or each plural words of storage data, the mask information enabling to set in accordance with a valid state or an invalid state whether or not each single bit or each plural bits of the storage data should be excluded from a search object; said router comprising: i) means for generating an arithmetic result output signal as a result of a first logical operation between a matched mask logical AND information and a search data in a manner that a primary search operation for excluding a single bit or plural bits for each word of the storage data corresponding to a mask information from the search object when the mask information is valid is performed wherein a destination network address of input transfer data is selected as the search data, and the matched mask logical AND information is generated in such a manner to conduct a logical AND operation between each mask information corresponding to the storage data which matches with the destination network address with assuming the valid state of the mask information as true; ii) means for outputting a match signal to identify the routing information having the storage data matching with information of the arithmetic result output line; and iii) means for determining a transfer address of the input transfer data in response to the match signal.

According to a seventeenth aspect of this invention, there is provided a network system for communicating data between devices connected to a network through the router.

DETAILED DESCRIPTION OF THE PREFERRED EMBODIMENT

Figure 1:
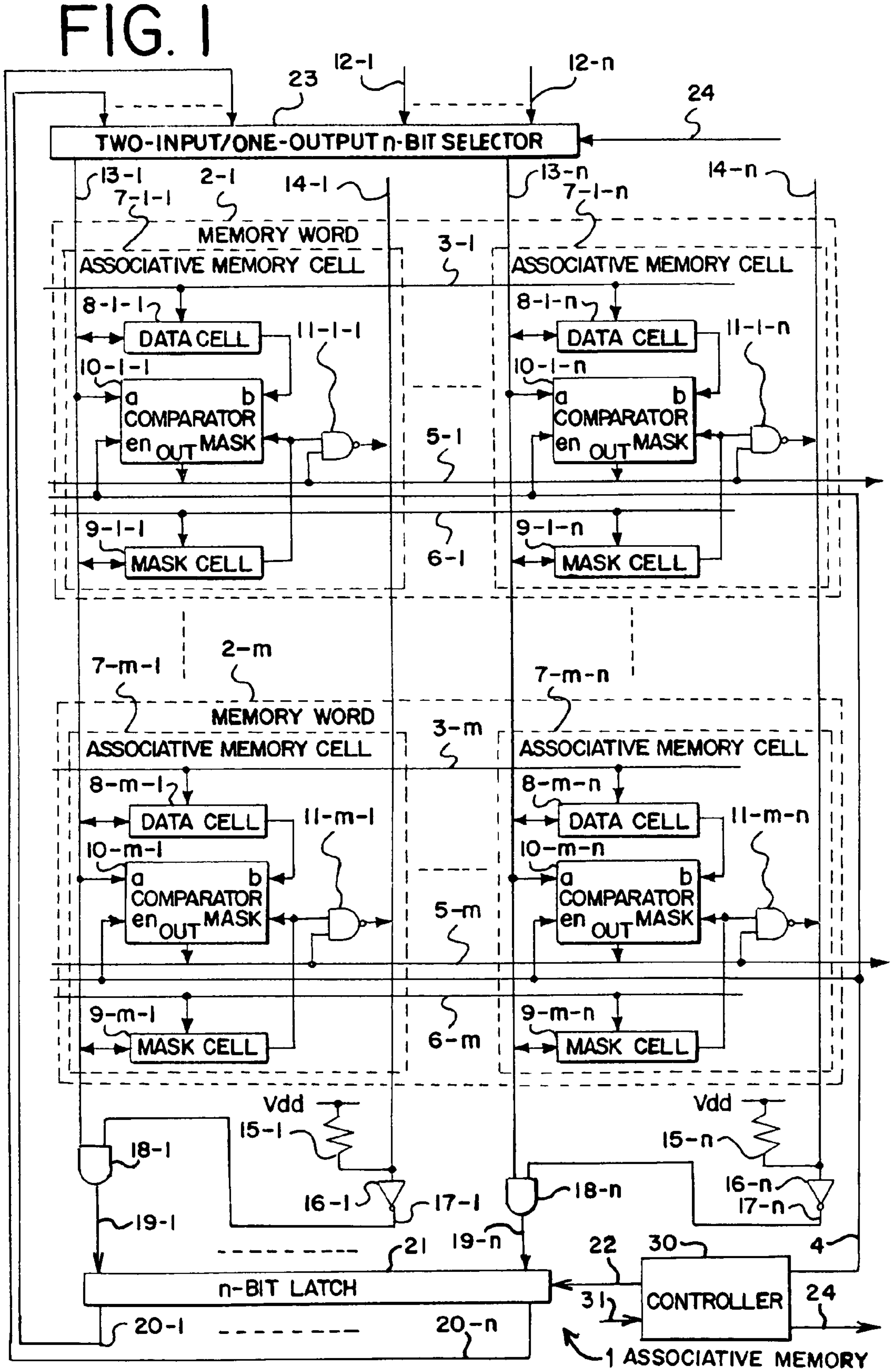
FIG. 1 is a block diagram of an associative memory according to a first embodiment of this invention.

Now, description will be made in detail about several preferred embodiments of the present invention with reference to the drawing.

Referring to FIG. 1, a associative memory 1 according to a first embodiment of this invention comprises a two-input/one-output n-bit selector 23, first through m-th n-bit associative memory words 2, an n-bit latch 21, an controller 30, first through m-th inverted logical gates 16, and first through m-th logical gates 18. Each associative memory word 2-j (where j is and integer variable between 1 and m, both inclusive) comprises first through n-th associative memory cells 7-j-1 through 7-j-n. Each of the associative memory words 2-j is connected to the corresponding data word line 3-j, the corresponding mask word line 6-j and a comparison control line as input lines and to the corresponding match line 5-j and the first through the n-th matched mask intermediate logic lines 14 as output lines and to the first through the n-th bit lines 13 as data input/output lines.

Each of the associative memory cells 7-j-k (where k is and integer variable between 1 and n, both inclusive) is connected to the corresponding data word line 3-j, the corresponding mask word line 6-j, and the comparison control signal 4 as input lines, and to the corresponding match line 5-j and the corresponding matched mask intermediate logic line 14-k as output lines, and to the corresponding bit line 13-k as data input/output line.

Each associative memory cell 7-j-k comprises a data cell 8-j-k, a comparator 10-j-k, a mask cell 9-j-k, and logical gate 11-j-k. The data cell 8-j-k is for storing "data" bit information at a corresponding bit of storage data supplied from an external source through a bit line 13-k. The comparator 10-j-k is for comparing the "data" bit information memorized in the data cell 8-j-k and "search" bit information 12-k at a corresponding bit of search data supplied from the external source. The mask cell 9-j-k is for storing "mask" bit information of a corresponding bit of mask information supplied from the external source through the bit line 13-k. Herein, when the bit information stored in the mask cell 9-j-k is in a valid state for mask information, an invalid state for storage data is stored in the corresponding data cell 8-j-k.

In this embodiment, a valid state and an invalid state are represented by "0" and "1", respectively, for the mask information and the matched mask logical-AND lines 17-1 through 17-n. A valid state and an invalid state are represented by "1" and "0", respectively, for the storage data and the match lines 5-1 through 5-m.

The operations of the data word lines 3-1 through 3-m and the data cells 8-1-1 through 8-m-n are similar, respectively, to the operations of the data word lines 106-1 through 106-m and the data cells 108-1-1 through 108-m-n of the conventional associative memory 116. The operations of the mask word lines 6-1 through 6-m and the mask cells 9-1-1 through 9-m-n are similar, respectively, to the operations of the mask word lines 111-1 through 111-m and the mask cells 112-1-1 through 112-m-n of the conventional associative memory 116.

Prior to the start of the searching operation, the match line 5 is precharged to a high level to be put into a valid state "1". The comparator 10 is supplied with the value of the search data on the corresponding bit line 13, the storage data stored in the data cell 8 in the same associative memory cell 7, the mask information stored in the mask cell 9 in the same associative memory cell 7, and the comparison control signal 4. When the comparison control signal 4 is in an invalid state "0" and the mask information is in a valid state "0", the comparator 10 puts the corresponding match line 5 into an opened state. Otherwise, if the value on the corresponding bit line 13 and the storage data stored in the data cell 8 are coincident with each other, the corresponding match line 5 is put into an opened state. Upon incoincidence, the corresponding match line 5 is put into an invalid state "0". Thus, the wired AND logic connection with the valid state "1" for the match line 5 as true is achieved such that, when all of the comparator 10, n in number, in the associative memory word 2 render the match line 5 in an opened state, the match line 5 is put into a valid state "1" and otherwise into an invalid state "0". In other words, upon the searching operation, only when the comparison control signal 4 is in an invalid state "0" and all of the storage data stored in an associative memory word 2 is completely coincident with the bit lines 13-1 through 13-n except those bits excluded from a comparison object by the mask valid state "0" in the corresponding mask information, the match line 5 is put into a valid state "1" and otherwise into an invalid state "0". Alternatively, an ordinary logical gate may be used as far as the similar operation is performed.

The logical gate 11 supplies an state "0" to the matched mask intermediate line 14 when the match line 5 in the same associative memory word 2 is in a valid state "1" and the storage data stored in the corresponding mask cell 9 is in an invalid state "1" for the storage data. Otherwise, the logical gate 11 puts the matched data intermediate logic line 14 into an opened state.

Each of the matched mask intermediate logic lines 14-1 through 14-n is pulled up by a corresponding register 15 to be put into a state "1". The matched mask intermediate logic line 14-k (where k is and integer variable between 1 and n, both inclusive) is connected to all of the corresponding logical gates 11-1-k through 11-m-k, m in number, by a wired logic connection.

Thus, when all of the first though m-th logical gates 11 connected to the corresponding matched mask intermediate logic line 14 render the matched mask intermediate logic line 14 in an opened state, the matched mask intermediate logic line 14 is put into a valid state "1" and otherwise into an invalid state "0". Each of the inverted logical gates 16-1 through 16-n supplies an inverted value of the corresponding matched mask intermediate logic line 14 to the corresponding matched mask logical-AND line 17. Therefore, the matched mask logical-AND line 17-k (where k is and integer variable between 1 and n, both inclusive) is supplied with the result of the logical multiplication operation, with the valid state for the mask information as true, of all the mask information stored in the memory word 2 which have the match line 5. In other words, the matched mask logical-AND line 17 possesses the same value of the mask information with the least number of in a valid state "0" among the mask information matched with the search data 12 during the searching operation.

Each of the logical gates 18-1 through 18-n is provided with the corresponding matched mask logical-AND line 17-1 through 17-n. The logical gate 18-k (where k is and integer variable between 1 and n, both inclusive) supplies a value of the corresponding bit line 13-k to the corresponding arithmetic result output line 19-k when the corresponding matched mask logical-AND line 17-k is in an invalid state for mask information, or supplies an invalid state of the corresponding storage data to the corresponding arithmetic result output line 19-k, when the corresponding matched mask logical-AND line 17-k is in a valid state for mask information. Accordingly, the bits of the search data 12 corresponding to the bit positions in a valid state "0" of the mask information with the least number of bits in a valid state "0" among the mask information corresponding to the storage data coincident with the search data 12 during the searching operation.

The value of the search data 12, of which bits corresponding to the bit positions in a valid state "0" of storage e data coincident with the search data 12 is replaced by an invalid state for the storage data, and supplied to the arithmetic result output line 19-1 through 19-n. In this embodiment, an invalid state for the mask information and storage data are represented by "1" and "0", respectively. Therefore, the logical gate 18-1 through 18-n is composed of the logical multiplication gate with the valid state "1" as true.

Then-bit latch 21 stores the states of the arithmetic result output line as stored states when a latch control signal 22 is in a valid state. The n-bit latch 21 supplies the stored states to the latch output lines 20-1 through 20-n.

With reference to the state of a selection signal 24, the two-input/one-output n-bit selector 23 selects, as output data to be supplied to the bit lines 13-1 through 13-n, either the search data 12-1 through 12-n or latch output lines 20-1 through 20-n.

The controller 30 supplies a latch control signal 4 and a selection signal 24 synchronizing with a clock signal 31, in order to control operation of the associative memory 1.

Figure 2:
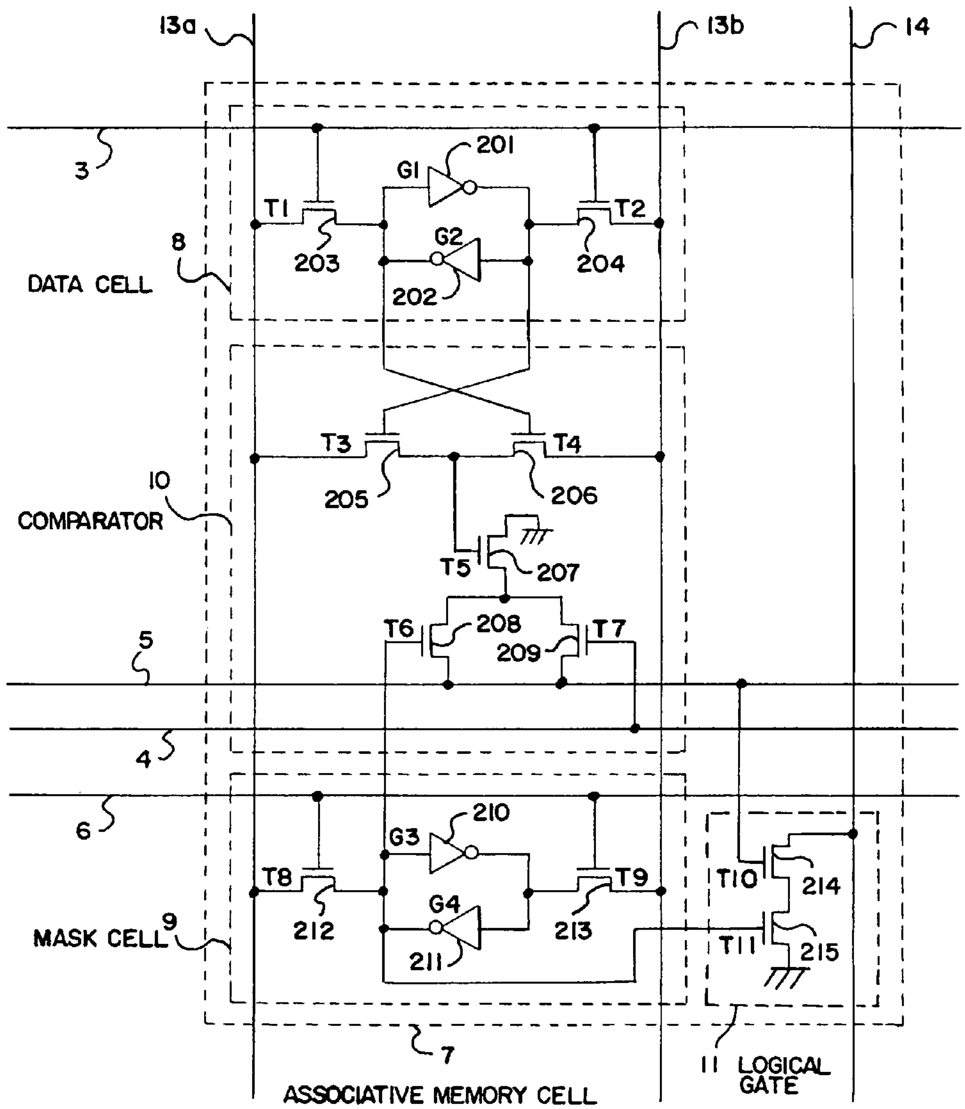
FIG. 2 is a circuit diagram of an associative memory cell illustrated in FIG. 1.
Figure 15:
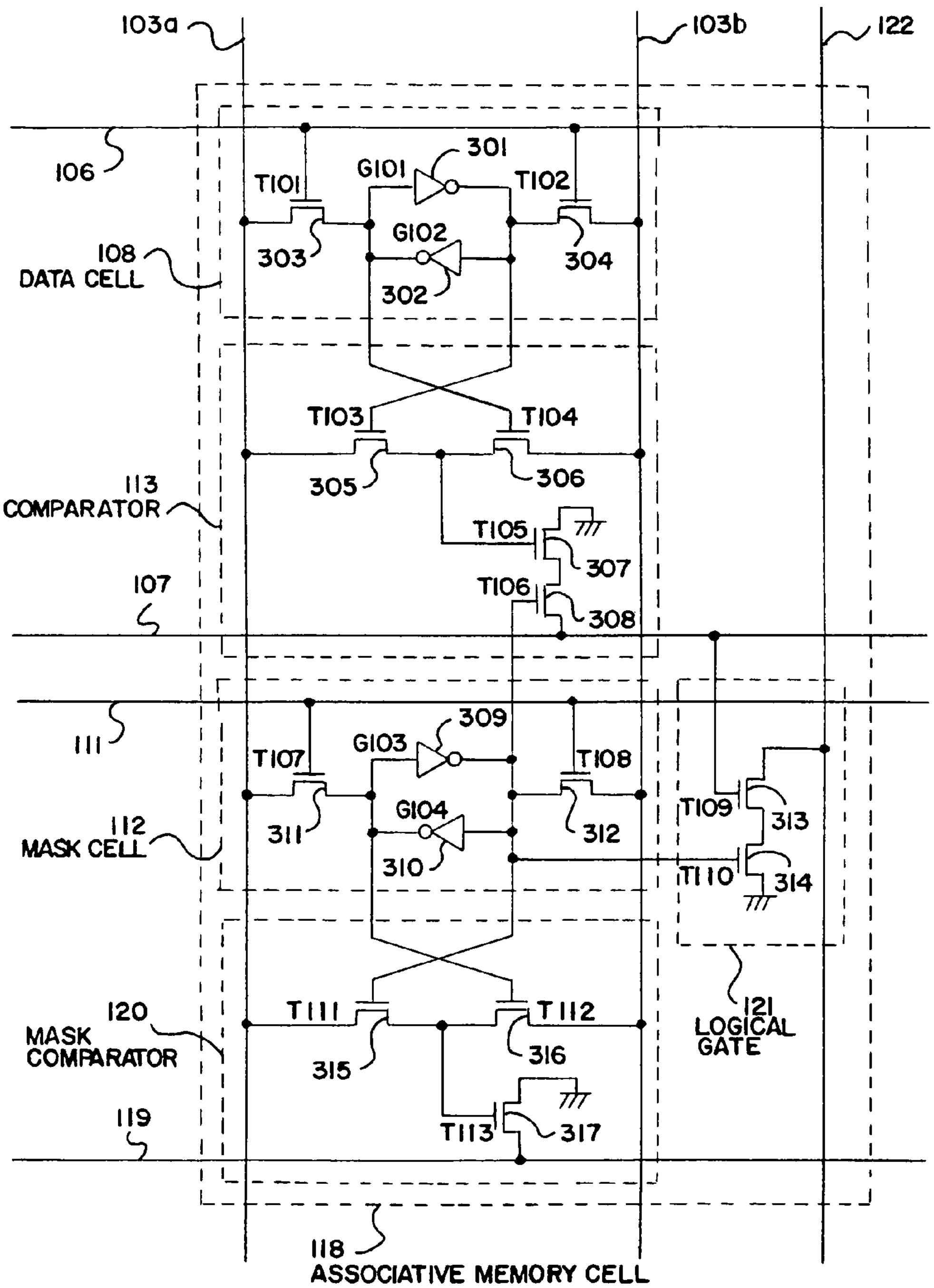
FIG. 15 is a circuit diagram of an associative memory cell illustrated in FIG. 14.
Figure 16:
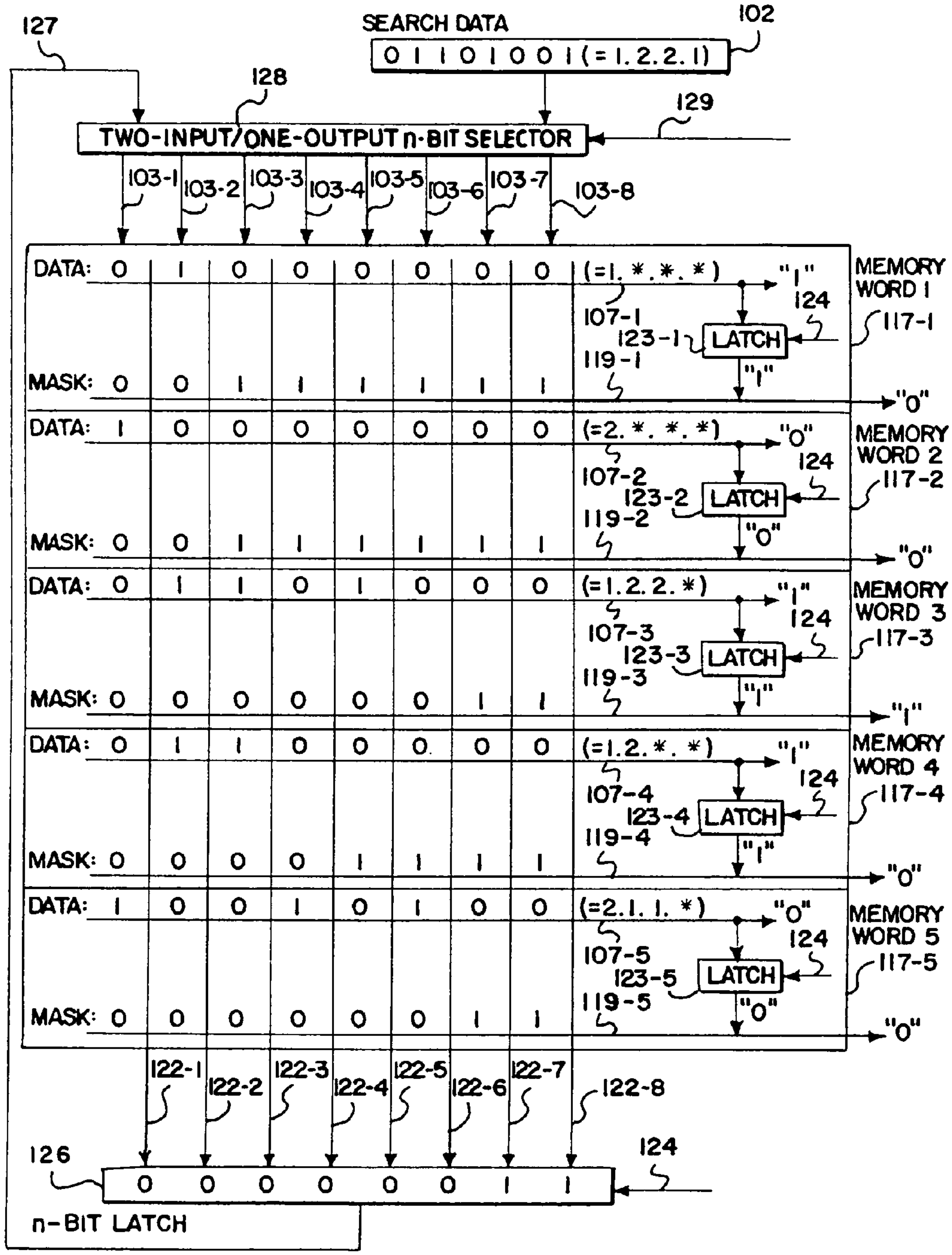
FIG. 16 is a view for describing an operation of the associative memory in FIG. 14.
Figure 17:
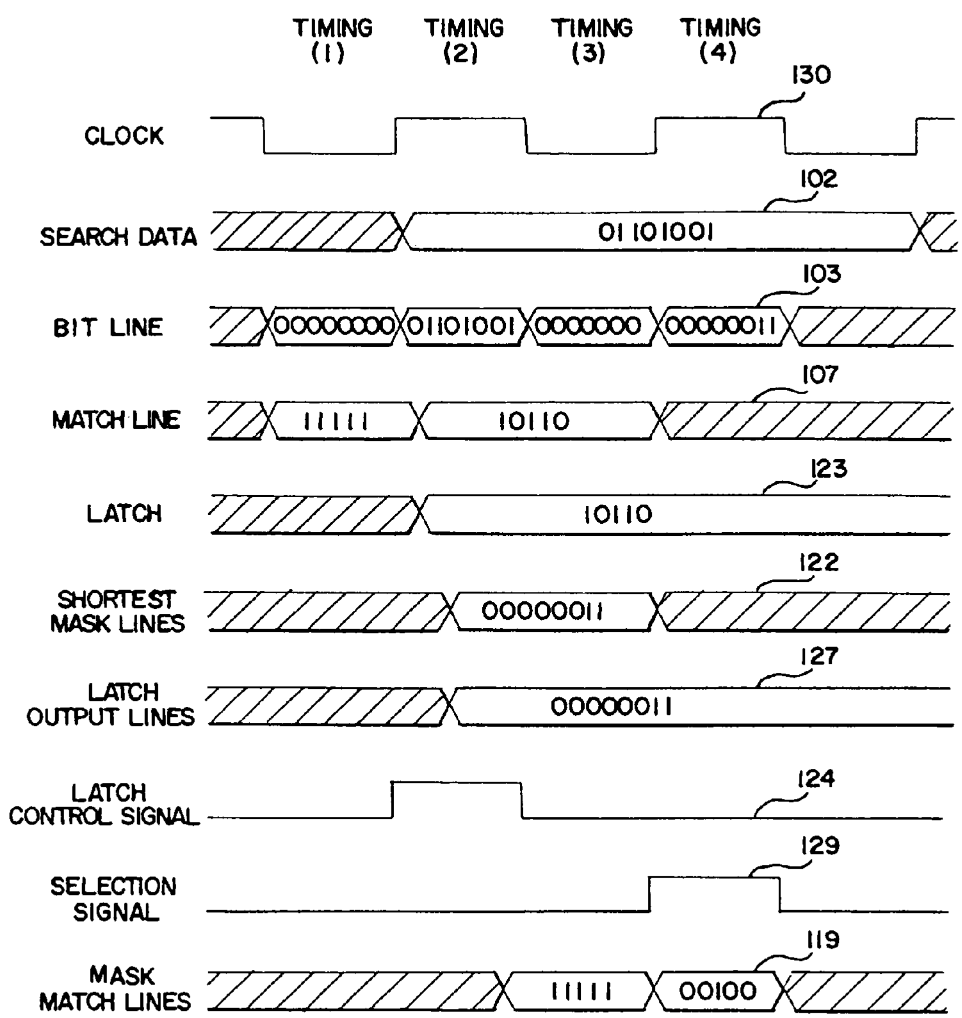
FIG. 17 is a timing chart for describing the operation of the associative memory in FIG. 14.

Next, referring to FIG. 2, each of the bit lines 13*a* and 13*b*, the data word line 3, the data cell 8, the mask word line 6, and the mask cell 9 in the associative memory cell 7 is similar to the corresponding component in the conventional associative memory cell 118 illustrated in FIG. 15.

Therefore, description will be directed only to components different from the conventional associative memory cell 118. In this embodiment, mask comparator 120 and mask match line 119 are unnecessary to the associative memory cell 7.

The comparator 10 comprises a MOS transistor (T3) 205, a MOS transistor (T4) 206, a MOS transistor (T5) 207, a MOS transistor (T6) 208, and a MOS transistor (T7) 209. The MOS transistor (T3) 205 and the MOS transistor (T4) 206 are inserted between the bit lines 13*a* and 13*b* in cascade. The MOS transistor (T3) 205 is rendered conductive when the inverted logical gate (G1) 201 in the data cell 8 produces an output of a high level. The MOS transistor (T4) 206 is rendered conductive when the inverted logical gate (G2) 202 in the data cell 8 produces an output of a high level. The MOS transistor (T5) 207 and the parallel connection of the MOS transistor (T6) 208 and the MOS transistor (T7) 209 are connected between a low potential and the match line 5 in cascade. The MOS transistor (T6) 208 is rendered conductive when the inverted logical gate (G4) 211 in the mask cell 9 produces an output of a high level. The MOS transistor (T7) 209 is rendered conductive when the comparison control signal 4 is in a valid state "1".

The MOS transistor (T5) 207 is rendered conductive when a junction or node of the MOS transistor (T3) 205 and the MOS transistor (T4) 206 has a potential of a high level. When both the bit line 13*a* and the inverted logical gate (G1) 201 produce outputs of a high level or when both the bit line 13*b* and the inverted logical gate (G2) 202 produce outputs of a high level, the junction of the MOS transistor (T3) 205 and the MOS transistor (T4) 206 has a high level to render the MOS transistor (T5) 207 conductive.

Therefore, when the storage data stored in the data cell 8 and the search data 12 on the bit lines 13*a* and 13*b* are different from each other, the MOS transistor (T5) 207 is rendered conductive. The MOS transistor (T6) 208 is put into an opened state and conductive state when the mask information stored in the mask cell 9 is "0" and "1", respectively. The word match line 5 is precharged to a high potential prior to the start of the searching operation. This provides the wired AND connection such that, when a plurality of the associative memory cells 7 are connected to the match line 5 through both the MOS transistors (T6) 208 and the MOS transistors (T7) 209, the match line 5 is given a low level if at least one associative memory cell 7 produces an output of a low level.

When MOS transistor (T5) 207 is conductive and either of the MOS transistor (T6) 208 or the MOS transistor (T7) 209 is conductive, the associative memory cell 7 supplied an invalid state "0" to the match line 5. Otherwise, the match line 5 is put into an opened state. Specifically, when the mask information is in a valid state "0" and the comparison control signal 4 is in an invalid state "0", the match line 5 is put into an opened state irrespective of the result of comparison between the search data 12 and the storage data. Otherwise, the match line 5 is put into an opened state and supplied with an invalid state "0" when the search data 12 on the bit lines 13*a* and 13*b* and the storage data stored in the data cell 8 are coincident with each other and different from each other, respectively.

Next, the logical gate 11 and the matched mask intermediate logic line 14 will be described. The matched mask intermediate logic line 14 is pulled up by a resistor 15 (FIG. 1) to be put into a state "1" prior to a searching operation. The logical gate 11 comprises MOS transistors (T10 and T11) 214 and 215 connected in cascade between the matched mask intermediate logic line 14 and a low potential. The MOS transistor (T10) 214 is put into a conductive state and an opened state when a match line 5 is in a valid state "1" and an invalid state "0", respectively. The MOS transistor (T11) 215 is put into a conductive state and an opened state when an inverted logical gate (G4) 211 in the mask cell 9 produces an output of a high level and a low level, respectively, i.e., when the mask information stored in the mask cell 9 is in a valid state "1" and a invalid state "0", respectively. Thus, the logical gate 11 supplies an state "0" to the matched mask intermediate logic line 14 when the match line 5 is in a valid state "1" and the mask information stored in the mask cell 19 is in a valid state "1". Otherwise, the logical gate 11 puts the matched mask intermediate logic line 14 into an opened state.

Figure 3:
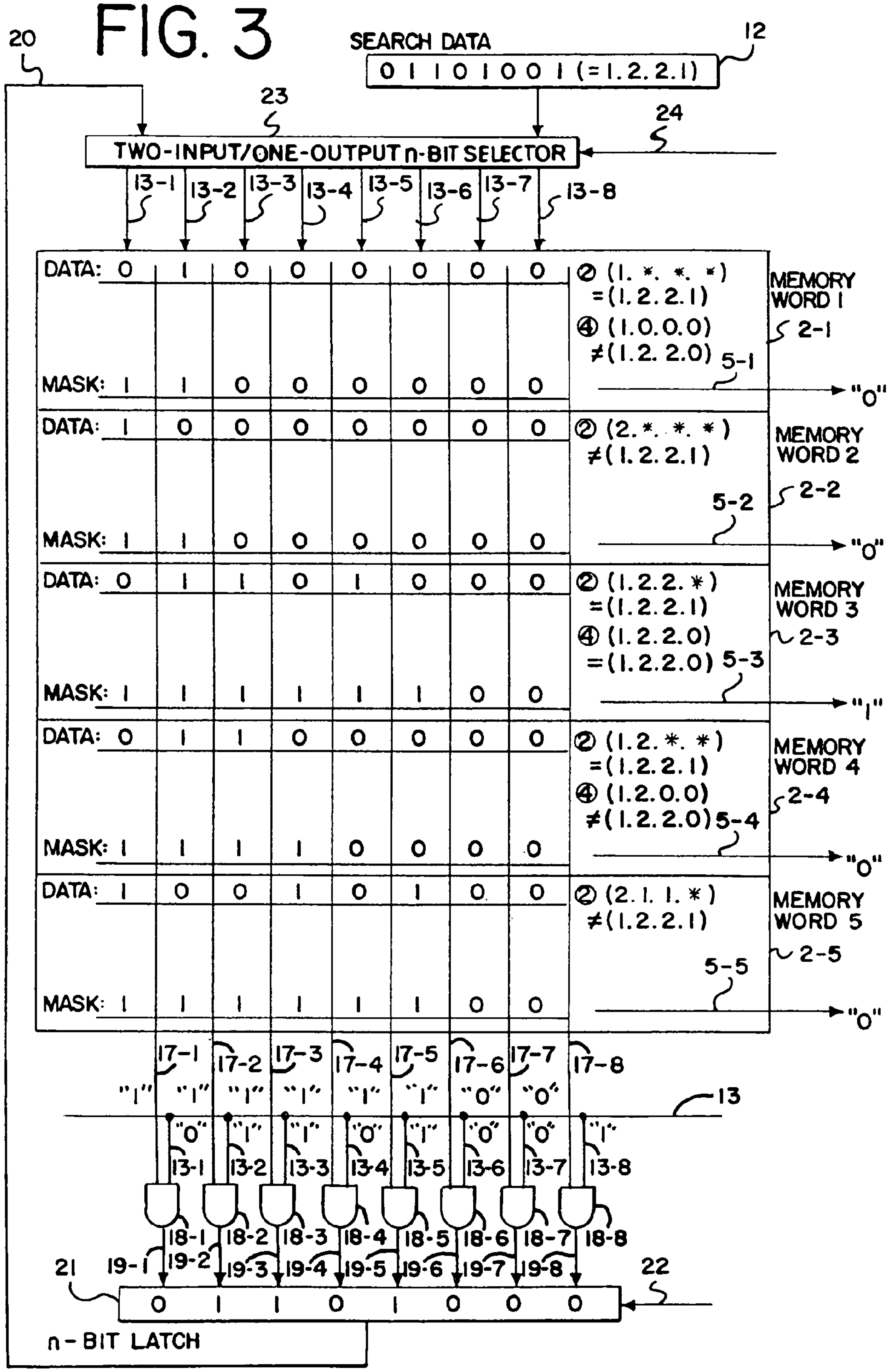
FIG. 3 is a view for describing an operation of the associative memory in FIG. 1.
Figure 4:
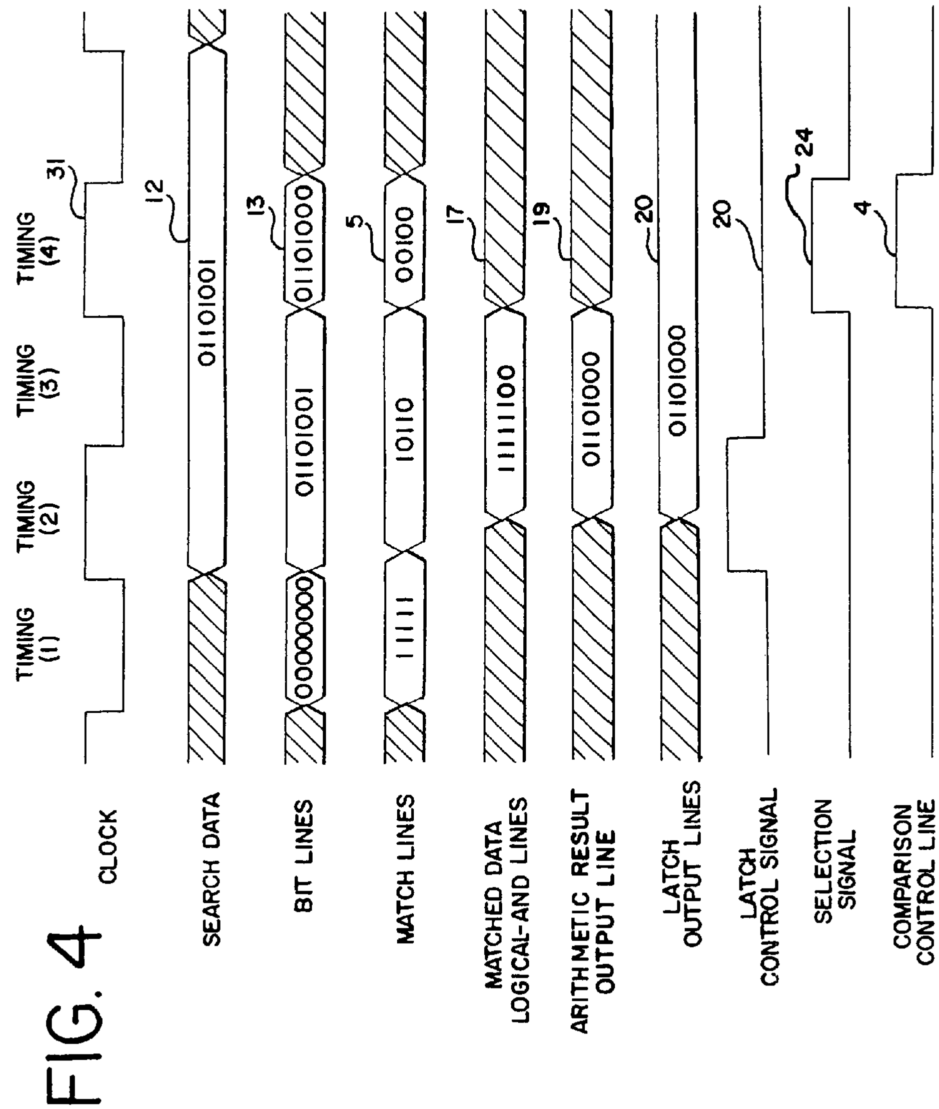
FIG. 4 is a timing chart for describing the operation of the associative memory in FIG. 1.

Next referring to FIG. 3, description will be made about the operation when the above-mentioned associative memory 1 is used in calculating the transfer network address in the router 400-3 in FIG. 18. Referring to FIG. 4, this operation will be described by the use of a timing chart.

It is assumed here that the associative memory 1 comprises five words of eight bits. The associative memory 1 memorizes the connection information in the associative memory words 2-1 through 2-5 except the network address (3, *, *, *) of the router 400-3 in FIG. 18. Herein, when a digit of a network address is represented by the symbol "*" as "don't care", the corresponding bit of the storage data is stored with an invalid state "0" for the storage data, and the corresponding bit of the mask information is stored with a valid state "0" for the mask information.

Specifically, the associative memory word 2-1 stores in binary numbers the storage data (01, 00, 00, 00) and the mask information (11, 00, 00, 00) to implement (1, *, *, *) Likewise, the associative memory word 2-2 stores in binary numbers the storage data (10, 00, 00, 00) and the mask information (11, 00, 00, 00) to implement (2, *, *, *). The associative memory word 2-3 stores in binary numbers the storage data (01, 10, 01, 00) and the mask information (11, 11, 11, 00) to implement (1, 2, 2, *). The associative memory word 2-4 stores in binary numbers the storage data (01, 10, 00, 00) and the mask information (11, 11, 00, 00) to implement (1, 2, *, *).

The associative memory word 2-5 stores in binary numbers the storage data (10, 01, 01, 00) and the mask information (11, 11, 11, 00) to implement (2, 1, 1, *).

Figure 18:
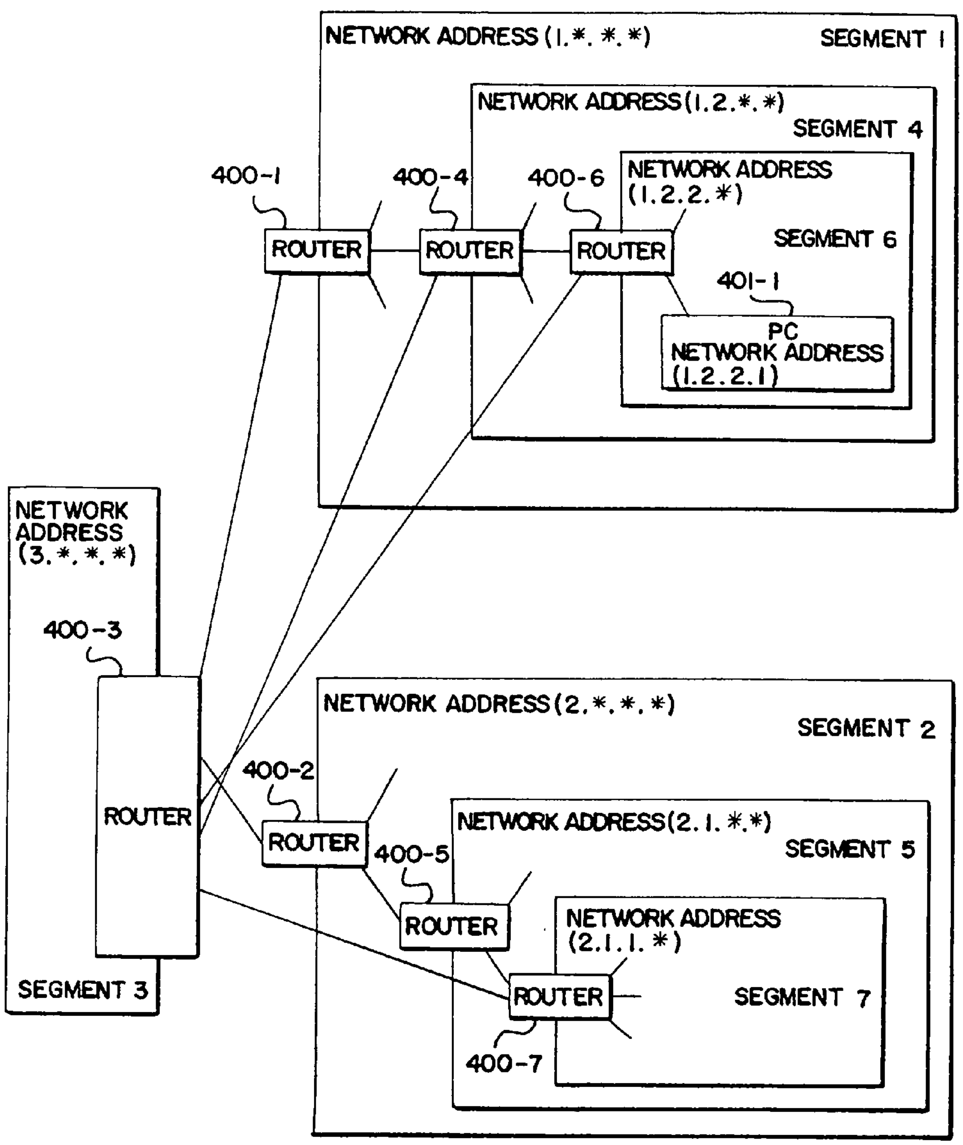
FIG. 18 schematically shows a typical network system.

Description will proceed to the searching operation by supplying as the search data 12 the network address (1, 2, 2, 1), in quadridecimal numbers, of the user's terminal (PC) 401-1 in FIG. 18.

At first, all of the match lines 5-1 through 5-8 are precharged to a high level ("1") to be put into a valid state "1" at the timing (1) in FIG. 4. Next, the two-input/one-output 8-bit selector 23 is responsive to the selection signal 24 which the controller 30 supplies, and selects the search data 12 to deliver the search data 12 to the bit lines 13-1 through 13-8 at the timing (2) in FIG. 4. The controller 30 puts the comparison control line 4 into an invalid state "0" in order to permit each of the associative memory cells 7-1-1 through 7-m-n to puts the corresponding match line 5 into an opened state irrespective of the result of comparison between the search data 12 and the storage data stored therein when the mask information stored therein is in a valid state "0". In other words, the searching operation is carried out taking the "don't care" state represented by the symbol "*" into account. Therefore, the quadridecimal notations (1, *, *, *), (1, 2, 2, *) and (1, 2, *, *) respectively stored in the associative memory words 2-1, 2-3 and 2-4 in the associative memory 1 are coincident with the search data 12 on the bit lines 13. Accordingly, the match lines 5-1, 5-3 and 5-4 are put into a valid state "1" while the remaining match lines 5-2, and 5-5 are put into an invalid state "0".

Herein, the matched mask logical-AND line 17-1 produces the logical multiplication "1", with "0" as true, of the mask information bit data "1", "1" and "1" in the memory words 2-1, 2-3 and 2-4 at bit positions corresponding to the matched mask intermediate logic line 14-1. The matched mask logical-AND line 17-2 produces the logical multiplication "1", with "0" as true, of the mask information bit data "1", "1" and "1" in the memory words 2-1, 2-3 and 2-4 at bit positions corresponding to the matched mask intermediate logic line 14-2. Likewise, the matched mask logical-AND lines 17-3, 17-4, 17-5, 17-6, 17-7, and 17-8 produce the logical multiplication "1" of "0", "1" and "1", the logical multiplication "1" of "0", "1" and "1", the logical multiplication "1" of "0", "1" and "0", the logical multiplication "1" of "0", "1" and "0", the logical multiplication "0" of "0", "0" and "0", and the logical multiplication "0" of "0", "0" and "0", respectively, with "1" as true. As a result, the binary notation "11111100" is delivered to the matched mask logical-AND lines 17-1 through 17-8. Each of the logical gates 18-1 through 18-8 is provided with both status of the corresponding bit positions of "11111100" as the value of the matched mask logical-AND line 17-1 through 17-8, and "01101001" as the value of the search data 12 supplied to the bit line 13-1 through 13-8. Then, as mentioned above, the logical gates 18-1 through 18-8 also supplies "01101000" as the result of the logical multiplication to the arithmetic result output line 19-1 through 19-8, with "1" as true.

In this state, the controller 30 puts the latch control signal 22 into valid state. The n-bit latch 21 stores the states of the arithmetic result output line 19-1 through 19-8. Accordingly, the n-bit latch 21 stores the binary notation "01101000". The n-bit latch 21 delivers the stored state "01101000" to the latch output line 20-1 through 20-8.

The timing (3) in FIG. 4 is inserted in order to arrange the state of the clock signal 31 of the timing (2) and the timing (4) so that the associative memory 1 holds the states of the timing (2). Timing (3) is unnecessary if the controller 30 can operate when the state of the clock signal 31 of the timing (2) and the timing (4) is different.

At the timing (4) in FIG. 4, in response to the selection signal 24 which the controller 30 supplies, the two-input/one-output n-bit selector 23 selects the latch output line 20 and supplies the information "01101000" on the latch output line 20 to the corresponding bit lines 13-1 through 13-8. Thereafter, the associative memory 1 starts a second searching operation. In the second searching operation, use is made of the states of result of the first searching operation at the timing (2) that is maintained on the match lines 5-1 through 5-8. In this example of the operation, the match line 5-1, 5-3 and 5-4 maintain a valid state "1" while the match line 5-2 and 5-5 maintain an invalid state "0". Use may be made of a storage apparatus that stores the states of result of the first searching operation at the timing (2) so that use is made of the state stored therein in the second searching operation. The controller 30 puts the comparison control signal 4 into valid state "1". Thus, each of the associative memory cells 7-1-1 through 7-m-n to puts the corresponding match line 5 into an invalid state "0" irrespective of the mask information stored therein when the storage data stored therein is different from the states of the bit lines 13-1 through 13-8. In other words, the second searching operation is carried out irrespective of the "don't care" state represented by the symbol "*". Therefore, the match line 5 is put into an invalid state "0" when the storage data stored in the corresponding associative memory word 2 is different from the states "01101000" of the bit lines 13-1 through 13-8.

In this example of the operation, the storage data stored in the associative memory word 2-3 is completely coincident with the states "01101000" on the bit lines 13-1 through 13-8 so that the corresponding match line 5-3 is put into an opened state. Since the storage data stored in any other associative memory words 2-1, 2-2, 2-4 and 2-5 is not coincident, the corresponding match lines 5-1, 5-2, 5-4, and 5-5 are supplied with an invalid state "0". Thus, in the match line 5-1, 5-3, 5-4 that maintain a valid state "1" prior to the start of the second searching operation, the only match line 5-3 can maintain a valid state "1" upon completion of the second searching operation.

It will therefore be understood that, in the match lines 5 corresponding to one of the storage data coincident with the search data 12 taking the mask information into account, the only match line 5-3 corresponding to the storage data with the least number of bits in a mask valid state is put into a valid state.

As described above, the associative memory 1 carries out both the first searching operation and the second searching operation using the same comparators 10-1-1 through 10-m-n and supplies the result of both the first search operation and the second search operation to the same match lines 5-1 through 5-m. Therefore, by the use of the associative memory of the first embodiment of this invention, it is possible to eliminate the mask comparator from the associative memory cell 7 illustrated in FIG. 2 as compared with the conventional associative memory cell 118 illustrated in FIG. 15. Herein, it is assumed that the circuit area of each MOS transistor that composes the comparator 10 and the logical gate 11 is 10 times as the circuit area of the minimum MOS transistor and the circuit area of a typical SRAM (Static Random Access Memory) is 6 times as the circuit area of the minimum MOS transistor. Accordingly, as readily understood from FIG. 2, the circuit area of the associative memory cell 7 is 82 times as the circuit area of the minimum MOS transistor. As described above, the circuit area of the conventional associative memory cell 118 is 102 times as the circuit area of the minimum MOS transistor. Consequently, the associative memory cell of the first embodiment of this invention can be realized in a circuit area smaller about 20% than the circuit area of the conventional associative memory cell 118 as given by 82/102=0.803.

Since the associative memory cell 7 of the first embodiment of this invention supplies the result of both the first search operation and the second search operation to the same match lines 5-1 through 5-m, the latch 123-1 through 123-m is unnecessary while the conventional associative memory 116 requires the latch 123 to store the result of the first searching operation until the start of the second searching operation. Therefore, circuit area of the associative memory is more reducible. Herein, if the associative memory comprises the first through 32768th 64-bit associative memory words and the latch 123 comprises 10 MOS transistors, the circuit area equivalent to about 330,000 transistors is reducible. Consequently, the associative memory cell of the first embodiment of this invention can reduce the whole circuit area by about 25% including above-mentioned reduced circuit area.

Since the result of both the first search operation and the second search operation is supplied to the same match lines 5-1 through 5-m, only the match lines 5-1 through 5-m, m in number, and the matched mask intermediate logic lines 14-1 through 14-n, n in number, require to be precharged for every searching operation. In other words, only the lines, (m+n) in number, require to be precharged for every searching operation.

As described above, when the conventional associative memory 116 carries out the search operation, the data match lines 107-1 through 107-m, m in number, the mask match lines 119-1 through 119-m, m in number, and the shortest mask lines 122-1 through 122-n, n in number, require to be precharged for every searching operation. Specifically, the lines, (2m+n) in number, require to be precharged for every searching operation. Herein, if the associative memory comprises the first through 32768th 64-bit associative memory words, the associative memory 1 of the first embodiment of this invention requires the 65,600 lines to be precharged of the whole and the conventional associative memory 116 requires the 32,832 lines to be precharged of the whole, for every searching operation. Therefore, the associative memory of the first embodiment of this invention can be realized in the power consumption smaller about 50% than the power consumption of the conventional associative memory 116 as given by 32,832/65,600= 0.500.

The reduction in the circuit area accompanies with a reduction in the wiring length of the bit lines 13-1 through 13-n and matched mask intermediate logic line 14-1 through 14-n. As readily understood from FIG. 2, when the associative memory cell 7 comprises the MOS transistors that have the above-mentioned circuit area, the wiring length can be shortened about 25%, compared with the conventional associative memory cell. Since the reduction in the wiring length accompanies with the reduction in the parasitic capacitances, the frequency of the clock signal 31 can be made higher about 32%, compared with the conventional associative memory.

Figure 5:
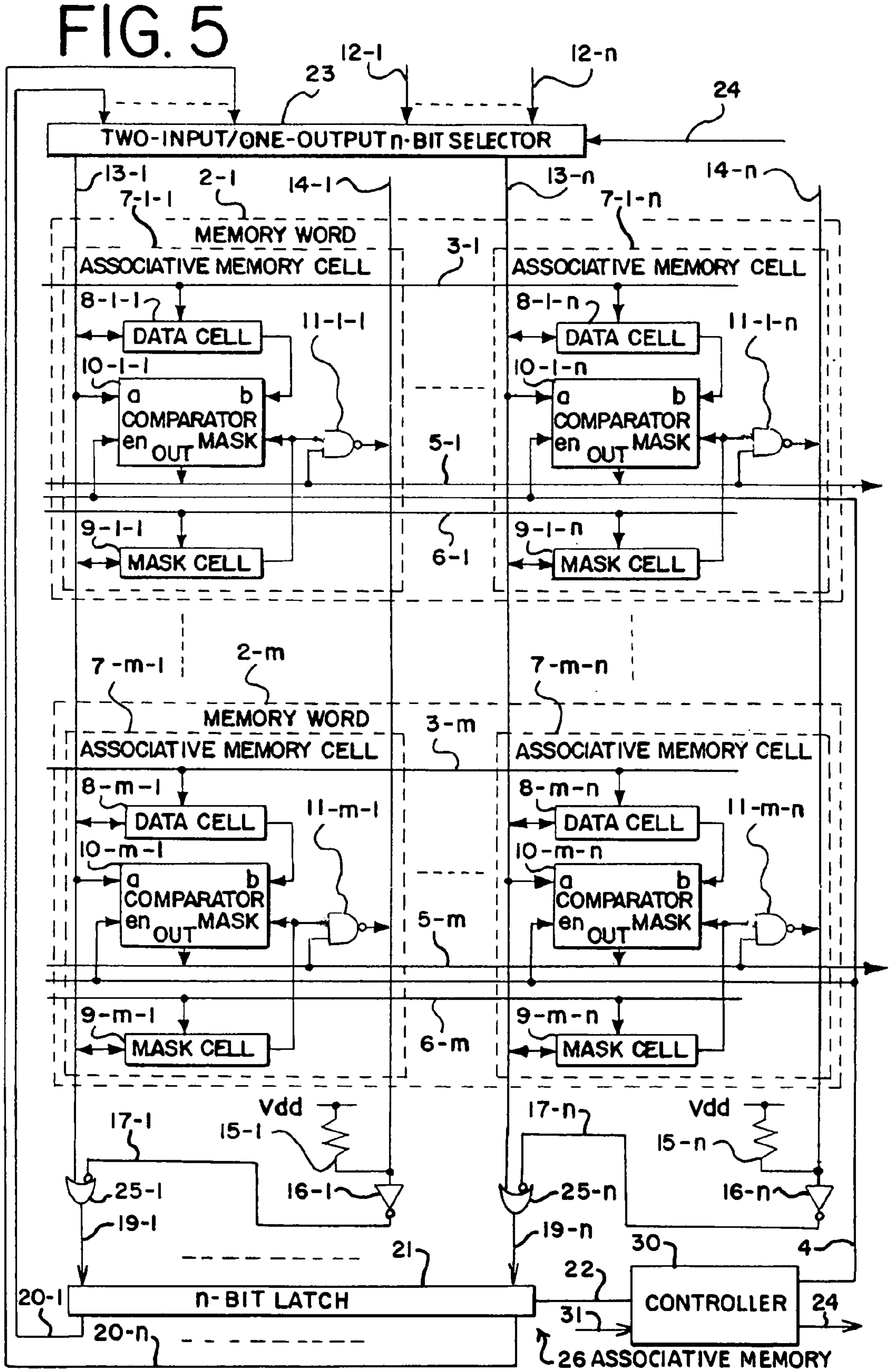
FIG. 5 is a block diagram of an associative memory according to a second embodiment of this invention.

Next referring to FIG. 5, description will be made about an associative memory 26 according to a second embodiment of this invention. The associative memory 26 of the second embodiment is similar to the associative memory 1 of the first embodiment, except changing structure of the logical gats 25-1 through 25-n and changing a valid state and an invalid state into "0" and "1" respectively, for the storage data. In the matter similar to the associative memory cell 7 of the first embodiment, when the bit information stored in the mask cell 9-j-k (where j is and integer variable between 1 and m, both inclusive) (where k is and integer variable between 1 and n, both inclusive) is in a valid state for mask information, an invalid state for storage data is stored in the corresponding data cell 8-j-k.

Similar to the first embodiment, each of the logical gates 25-1 through 25-n is provided with the corresponding bit line 13-1 through 13-n and matched mask logical-AND line 17-1 through 17-n, and supplies a value of the corresponding bit line 13 to the corresponding arithmetic result output line 19, when the corresponding matched mask logical-AND line 17 is in an invalid state for mask information, or supplies an invalid state of the storage data to the corresponding arithmetic result output line 19, when the corresponding matched mask logical-AND line 17 is in a valid state for mask information. Accordingly, the bits of the search data 12 corresponding to the bit positions in a valid state "0" of the mask information with the least number of bits in a valid state "0" among the mask information corresponding to the storage data coincident with the search data 12 during the searching operation. The value of the search data 12, of which bits corresponding to the bit positions in a valid state "0" of storage data coincident with the search data 12, is replaced by an invalid state for the storage data, and supplied to the arithmetic result output line 19-1 through 19-n. In this embodiment, an invalid state for the mask information and storage data are represented by "1" and "1", respectively. Therefore, the logical gate 25-1 through 25-n can be composed of the logical circuit which performs the logical-OR operation with the inverted state of the matched mask logical-AND line 17 and bit line 13, with a valid state 1 as true.

Figure 6:
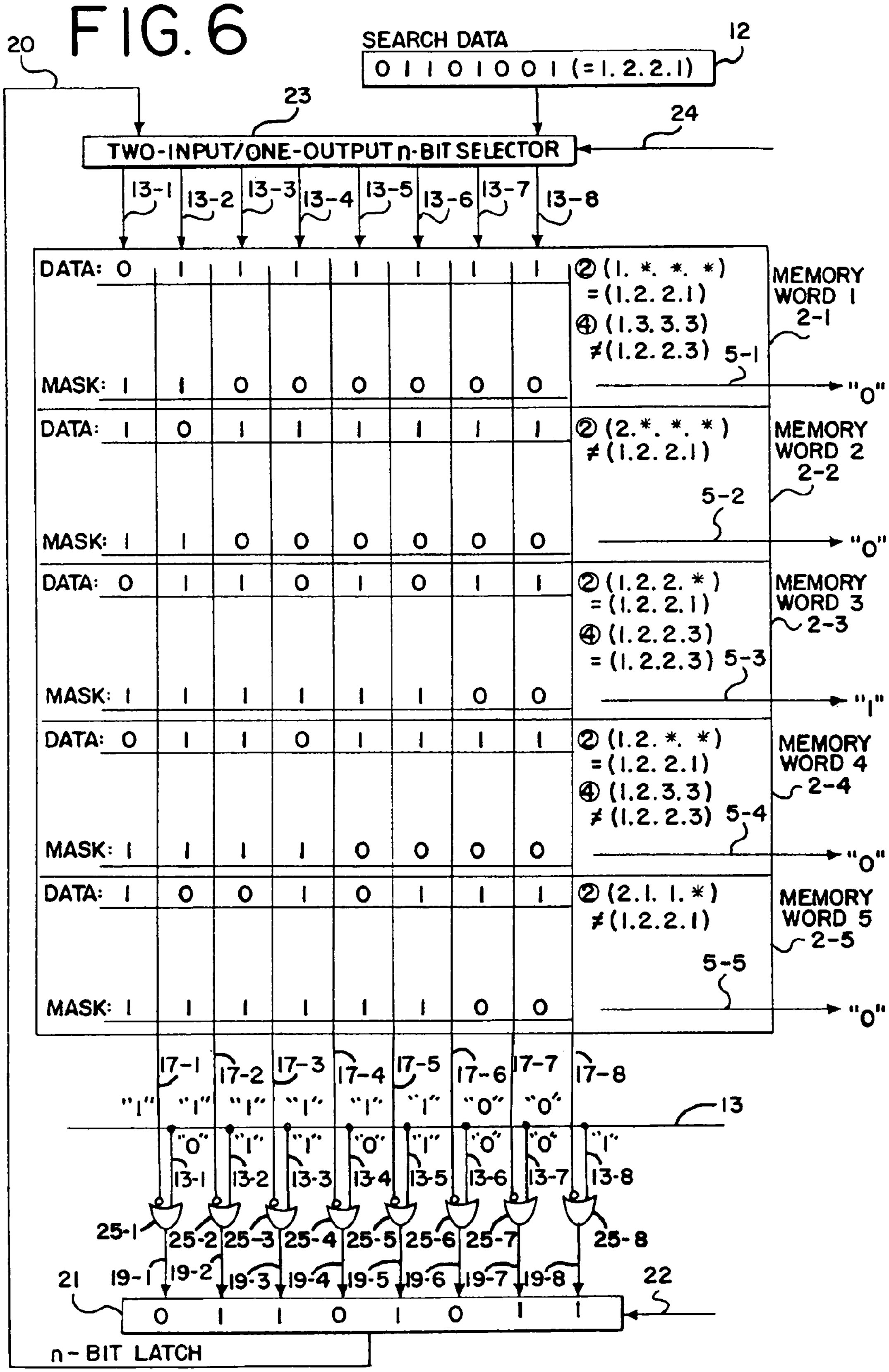
FIG. 6 is a view for describing an operation of the associative memory in FIG. 5.

Next referring to FIG. 6, description will be made about the operation when the above-mentioned conventional associative memory 26 is used in calculating the transfer network address in the router 400-3 in FIG. 18.

It is assumed here that the associative memory 26 comprises five words of eight bits. The associative memory 26 memorizes the connection information in the associative memory words 2-1 through 2-5 except the network address (3, *, *, *) of the router 400-3 in FIG. 18. Herein, when a digit of a network address is represented by the symbol "1" as "don't care", the corresponding bit of the storage data is stored with an invalid state "1" for the storage data, and the corresponding bit of the mask information is stored with a valid state "0" for the mask information.

Specifically, the associative memory word 2-1 stores in binary numbers the storage data (01, 11, 11, 11) and the mask information (11, 00, 00, 00) to implement (1, *, *, *). Likewise, the associative memory word 2-2 stores in binary numbers the storage data (10, 11, 11, 11) and the mask information (11, 00, 00, 00) to implement (2, *, *, *) The associative memory word 2-3 stores in binary numbers the storage data (01, 10, 01, 11) and the mask information (11, 11, 11, 00) to implement (1, 2, 2, *). The associative memory word 2-4 stores in binary numbers the storage data (01, 10, 11, 11) and the mask information (11, 11, 00, 00) to implement (1, 2, *, *). The associative memory word 2-5 stores in binary numbers the storage data (10, 01, 01, 11) and the mask information (11, 11, 11, 00) to implement (2, 1, 1, *), Description will proceed to the searching operation by supplying as the search data 12 the network address (1, 2, 2, 1), in quadridecimal numbers, of the user's terminal (PC) 401-1 in FIG. 18. Herein, description will be directed only to operations different from the associative memory 1 of the first embodiment of this invention.

Upon completion of the first searching operation, in the matter similar to the first embodiment, the quadridecimal notations (1, *, *, *), (1, 2, 2, *) and (1, 2, *, *) respectively stored in the associative memory words 2-1, 2-3 and 2-4 are coincident with the search data 12, and matched mask logical-AND line 17-1 through 17-8 is supplied with "11111100" in binary numbers. Each of the logical gates 18-1 through 18-8 is provided with both status of the corresponding bit positions of "11111100" as the value of the matched mask logical-AND line 17-1 through 17-8, and "01101001" as the value of the search data 12 supplied to the bit line 13-1 through 13-8. As mentioned above, the logical gates 18-1 through 18-8 also supplies "01101000" as the result of the logical multiplication to the arithmetic result output line 19-1 through 19-8, with "1" as true.

Upon completion of the second searching operation, the storage data stored in the associative memory word 2-3 is completely coincident with the states "01101000" on the bit lines 13-1 through 13-8 so that the corresponding match line 5-3 is put into an opened state. Since the storage data stored in any other associative memory words 2-1, 2-2, 2-4 and 2-5 is not coincident, the corresponding match lines 5-1, 5-2, 5-4, and 5-5 are supplied with an invalid state "0". Thus, in the match line 5-1, 5-3, 5-4 that maintain a valid state "1" prior to the start of the second searching operation, the only match line 5-3 can maintain a valid state 1 upon completion of the second searching operation.

It will therefore be understood that, in the match lines 5 corresponding to one of the storage data coincident with the search data 12 taking the mask information into account, the only match line 5-3 corresponding to the storage data with the least number of bits in a mask valid state is put into a valid state.

Although a valid bit for the mask information is represented by "0" in description of both the first embodiment and the second embodiment, a valid bit for the mask information can be represented by "1" as described below. As described above, when the bit information stored in the mask cell is in a valid state for mask information, an invalid state for storage data is stored in the corresponding data cell. Similar to the description above, it is possible to realize the same function of the associative memory of this invention by performing the logical multiplication operation of all the mask information stored in the corresponding data cells in each associative memory word, which have the match line that is in a valid state upon completion of the first searching operation, and supplying the corresponding state of the bit line when each bit of the matched mask logical-AND line supplied with the result of the logical multiplication is in an invalid state for the mask information, or supplying the invalid state for the storage data when each bit of the matched mask logical-AND line supplied with the result of the logical multiplication is in a valid state for the mask information, to the bit lines as the input state for the second search operation.

Although an invalid state for storage data is stored in the corresponding data cell when the bit information stored in the mask cell is in a valid state for mask information in description of both the first embodiment and the second embodiment, it is possible to realize the same function of the associative memory of this invention when the comparator 10 regards the state of the corresponding storage data as an invalid state for storage data if the corresponding mask information is in a valid state for mask information in the comparison of second searching operation.

Figure 7:
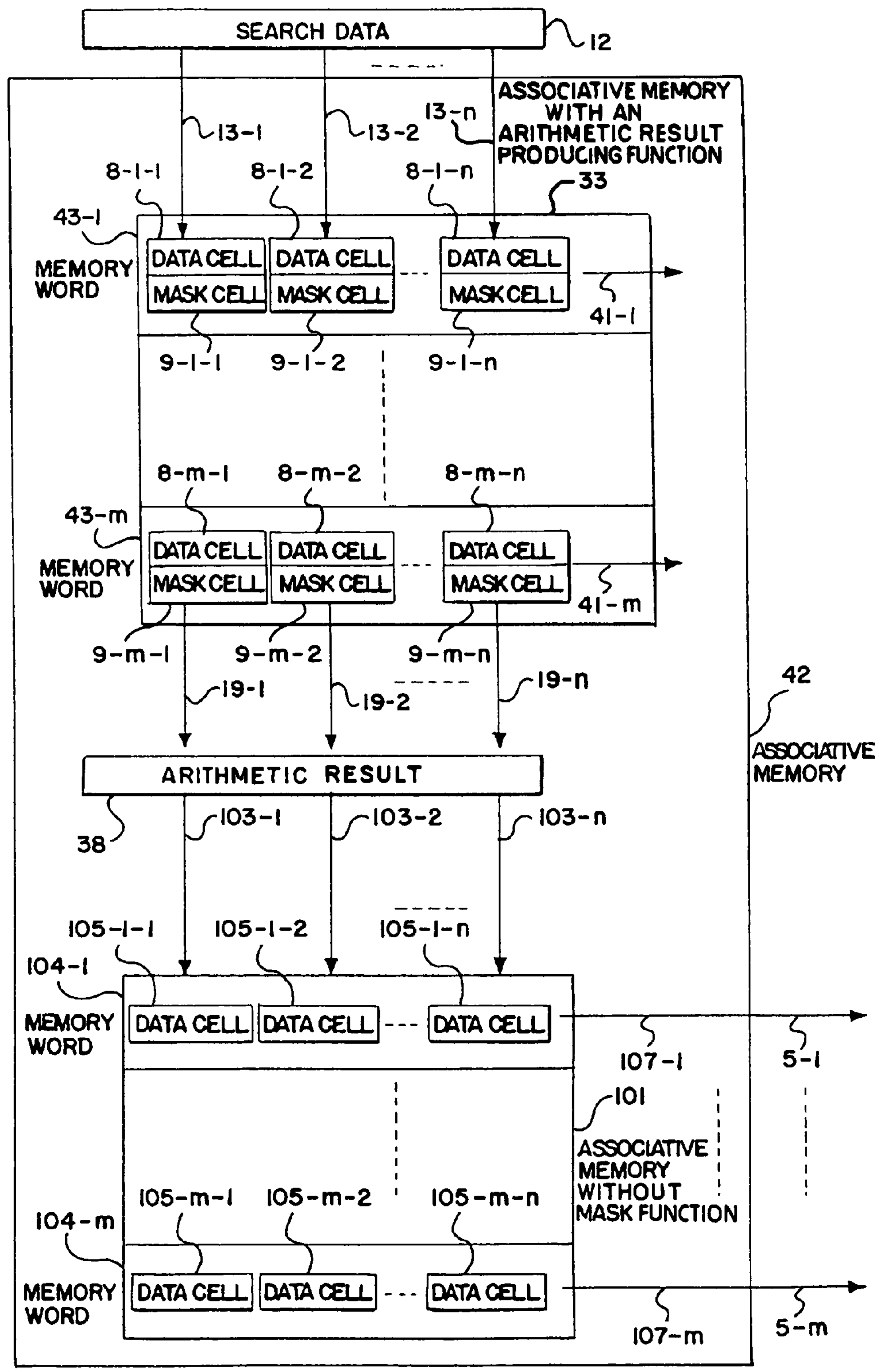
FIG. 7 is a block diagram of an associative memory according to a third embodiment of this invention.

Next referring to FIG. 7, description will be made about an associative memory 42 according to a third embodiment of this invention.

In this embodiment, the n-bit/m-word associative memory 33 with an arithmetic result producing function carries out the first searching operation and acquires an arithmetic result 38. Supplied with the arithmetic result 38, the n-bit/m-word associative memory 101 without mask function carries out the second searching operation and produces match lines 5-1 through 5-m.

The n-bit/m-word associative memory 33 with an arithmetic result producing function acquires a arithmetic result 38 in the matter similar to the associative memory 1 of the first embodiment, by the use of the search data 12 supplied to bit lines 13-1 through 13-n, n in number, storage data stored in the data cells 8-1-1 through 8-m-n and mask information stored in the mask cells 9-1-1 through 9-m-n for each associative memory word 43-1 through 43-m. The arithmetic result 38 is supplied to the arithmetic result output line 19-1 through 19-n, n in number. Herein, when the bit information stored in the mask cell 9-j-k (where j is and integer variable between 1 and m, both inclusive) (where k is and integer variable between 1 and n, both inclusive) is in a valid state for mask information, an invalid state for storage data is stored in the corresponding data cell 8-j-k.

The associative memory 101 without mask function, compares each of the second storage data stored in the first through n-th associative memory cell 105 for every associative memory word 104-1 through 104-m, m in number, with the arithmetic result 38 supplied to bit lines 103-1 through 103-n to supply a valid state "1" to the data match line 107 corresponding to the associative memory word 104 including the coincident second storage data. The associative memory 42 supplies the states of the data match lines 107-1 through 107-m to the match lines 5-1 through 5-m. Herein, when the bit information stored in the mask cell 9-j-k (where j is and integer variable between 1 and m, both inclusive) (where k is and integer variable between 1 and n, both inclusive) of the associative memory 33 with an arithmetic result producing function is in a valid state for mask information, an invalid state for storage data is stored in the corresponding data cell 105-j-k.

In this embodiment, a valid state and an invalid state for the mask information are represented by "0" and "1". A valid state and an invalid state are represented by "1" and "0", respectively, for all of the storage data, the matched mask logical-AND lines 17-1 through 17-n, and the match lines 5-1 through 5-m.

Figure 8:
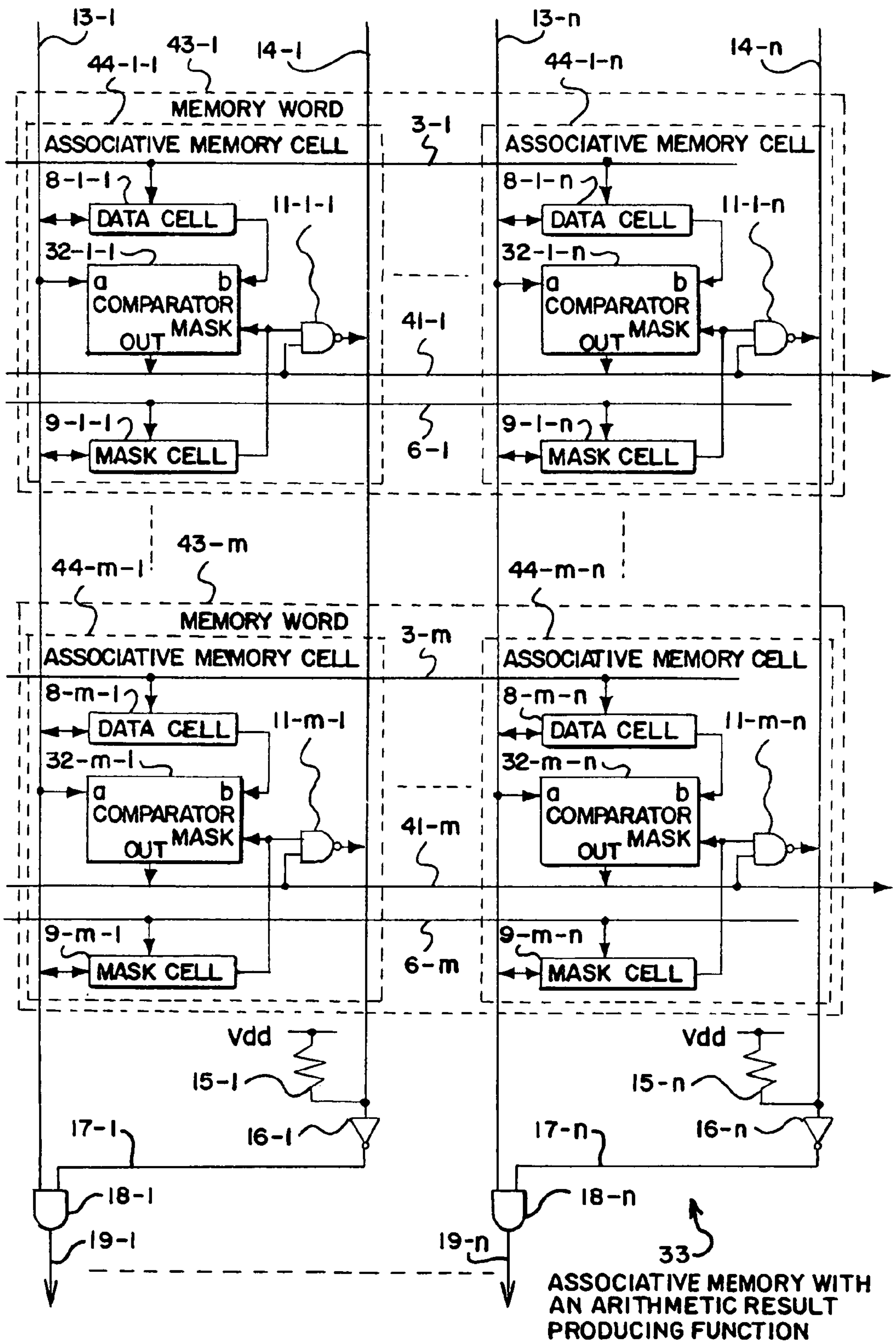
FIG. 8 is a block diagram of an associative memory with an arithmetic result producing function illustrated in FIG. 7.

Referring to FIG. 8, the associative memory 33 with an arithmetic result producing function comprises first through m-th n-bit associative memory words 43, first through m-th inverted logical gates 16, and first through m-th logical gates 18. Each associative memory word 43-j (where j is and integer variable between 1 and m, both inclusive) comprises first through n-th associative memory cells 44-j-1 through 44-j-n. The operation of the inverted logical gates 16-1 through 16-n and inverted gates 18-1 through 18-n is similar to the first embodiment.

Each of the associative memory words 43-j is connected to the corresponding data word line 3-j and the corresponding mask word line 6-j as input lines and to the corresponding intermediate match line 41-j and the first through the n-th matched mask intermediate logic lines 14 as output lines and to the first through the n-th bit lines 13 as data input/output lines.

Each of the associative memory cells 44-j-k (where k is and integer variable between 1 and n, both inclusive) is connected to the corresponding data word line 3-j and the corresponding mask word line 6-j as input lines, and to the corresponding intermediate match line 41-j and the corresponding matched mask intermediate logic line 14-k as output lines, and to the corresponding bit line 13-k as data input/output line.

Each associative memory cell 44-j-k comprises a data cell 8-j-k, a comparator 32-j-k, a mask cell 9-j-k, and logical gate 11-j-k. The data cell 8-j-k is for storing "data" bit information at a corresponding bit of storage data supplied from an external source through a bit line 13-k. The comparator 32-j-k is for comparing the "data" bit information memorized in the data cell 8-j-k and "search" bit information 12-k at a corresponding bit of search data supplied from the external source. The mask cell 9-j-k is for storing "mask" bit information of a corresponding bit of mask information supplied from the external source through the bit line 13-k.

Each operation of the data word line 3, the mask word line 6, the matched data intermediate line 14, the bit line 13, the data cell 8, the mask cell 9, and the logical gate 11 in the associative memory cell 43 is similar to the operation of the corresponding component in the associative memory cell 7 of the associative memory 1 of the first embodiment. The match line 5 in the associative memory cell 7 of the associative memory 1 of the first embodiment is renamed the intermediate match line 41. Therefore, description will be directed only to those components different from the associative memory cell 7 of the associative memory 1 of the first embodiment.

In this embodiment, when the bit information stored in the mask cell of the associative memory cell 8 is in a valid state for mask information, an invalid state for storage data is stored in the corresponding data cell 8.

Prior to the start of the searching operation, the intermediate match line 41 is precharged to a high level or pulled up by a resistor (not shown) to be put into a valid state "1".

The comparator 32 is supplied with the value of the search data on the corresponding bit line 13, the storage data stored in the data cell 8 in the same associative memory cell 44, and the mask information stored in the mask cell 9 in the same associative memory cell 44. When the mask information is in a valid state or when the value on the corresponding bit line 13 and the storage data stored in the data cell 8 are coincident with each other, the intermediate match line 41 is put into an opened state. Otherwise, the comparator 32 puts the intermediate match line 41 into an invalid state "0". Thus, the wired AND logic connection with the valid state "1" for the intermediate match line 41 as true is achieved such that, when all of the comparator 32, n in number, in the associative memory word 43 render the intermediate match line 41 in an opened state, the intermediate match line 41 is put into a valid state "1" and otherwise into an invalid state "0". In other words, upon the searching operation, only when all of the storage data stored in an associative memory word 43 is completely coincident with the bit lines 13-1 through 13-n except those bits excluded from a comparison object by the mask valid state "0" in the corresponding mask information, the intermediate match line 41 is put into a valid state "1" and otherwise into an invalid state "0". Alternatively, an ordinary logical gate may be used as far as the similar operation is performed.

Figure 9:
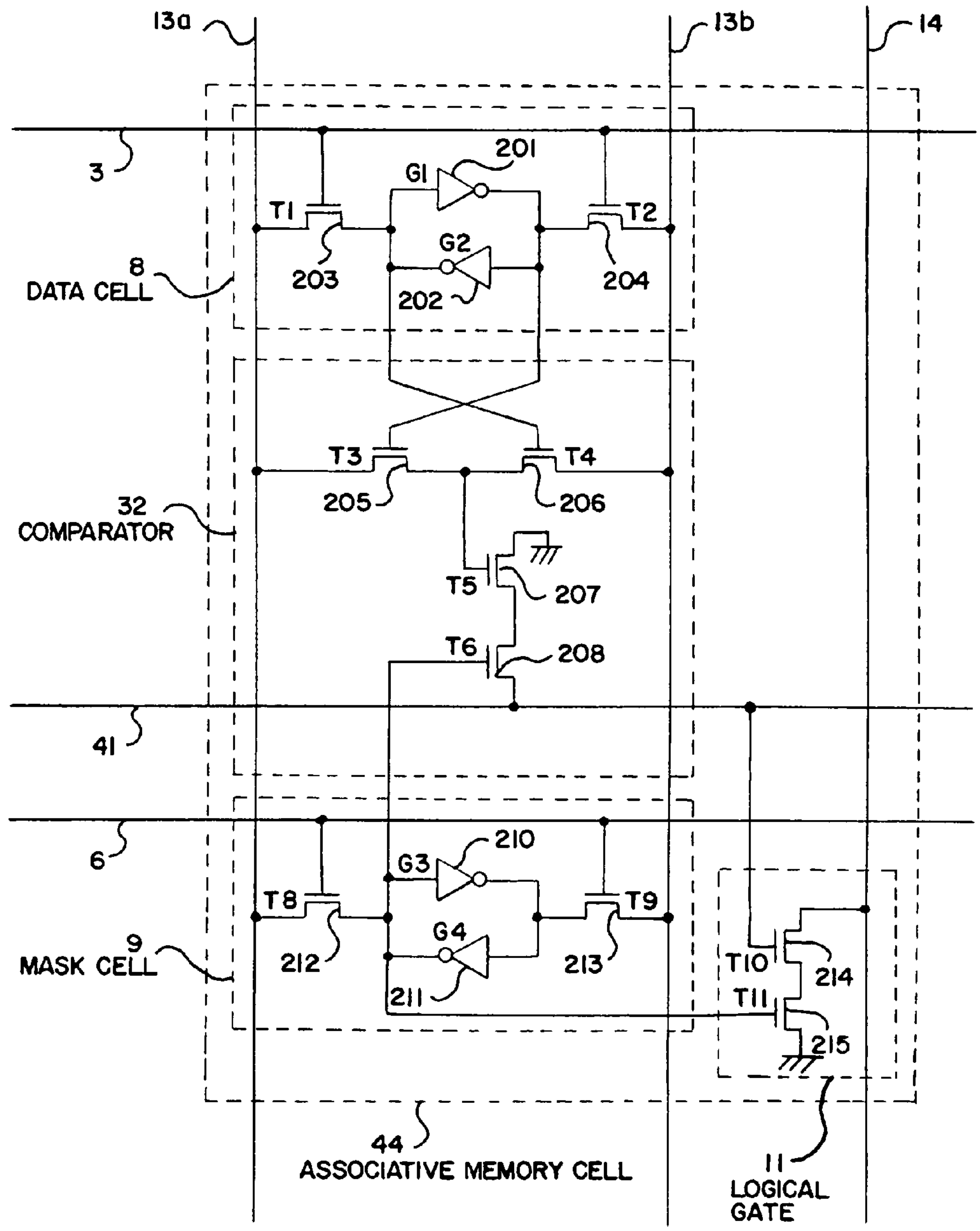
FIG. 9 is a circuit diagram of an associative memory cell illustrated in FIG. 8.

Next, referring to FIG. 9, the associative memory cell 44 is similar to the associative memory cell 7 of the first embodiment except eliminating the comparison control signal 4 and MOS transistor (T7) 209 in the comparator, and renaming the match line 5 the intermediate match line 41. Therefore, description will be directed only to components different from the associative memory cell 7 of the first embodiment.

The comparator 32 comprises a MOS transistor (T3) 205, a MOS transistor (T4) 206, a MOS transistor (T5) 207, and a MOS transistor (T6) 208. Each of those MOS transistors is similar to the corresponding MOS transistor in the associative memory cell 7 of the first embodiment.

When MOS transistor (T5) 207 is conductive and the MOS transistor (T6) 208 is conductive, the associative memory cell 44 supplied an invalid state "0" to the intermediate match line 41. Otherwise, the intermediate match line 41 is put into an opened state. Specifically, when the mask information is in a valid state "0", the intermediate match line 41 is put into an opened state irrespective of the result of comparison between the search data 12 and the storage data. Otherwise, the intermediate match line 41 is put into an opened state and supplied with an invalid state "0" when the search data 12 on the bit lines 13*a* and 13*b* and the storage data stored in the data cell 8 are coincident with each other and different from each other, respectively.

Figure 10:
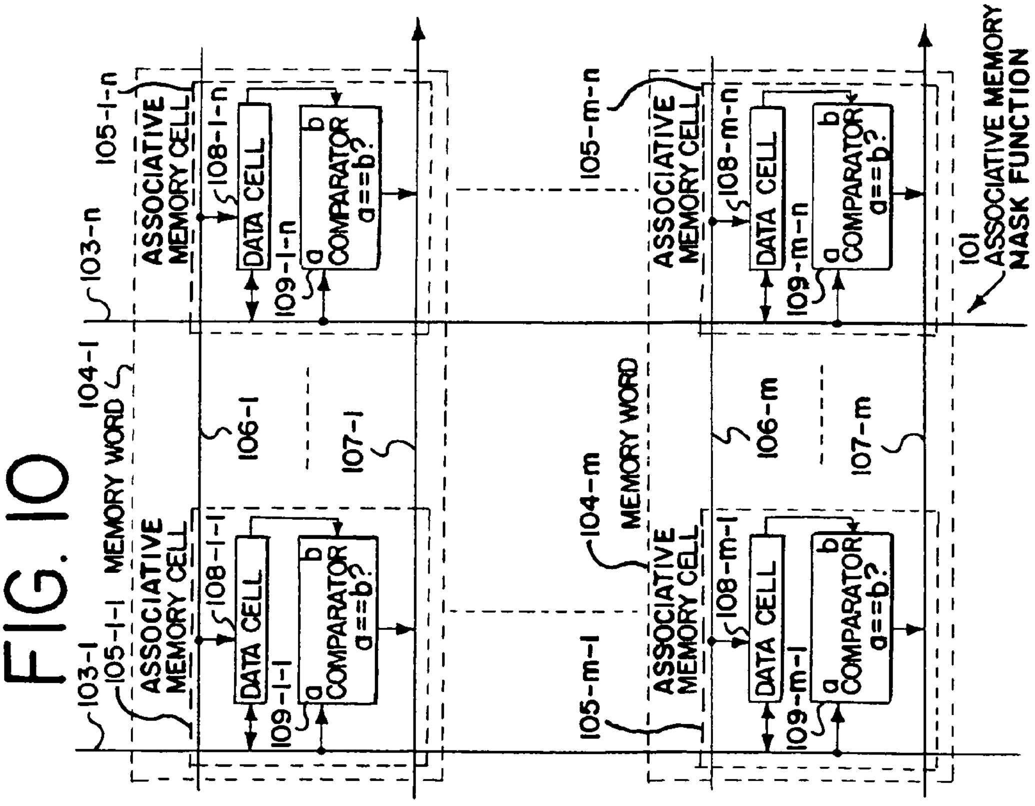
FIG. 10 is a block diagram of an associative memory without mask function.

Referring to FIG. 10, an n-bit/m-word associative memory 101 without mask function comprises first through m-th n-bit associative memory words 104. Each associative memory word 104-j (where j is and integer variable between 1 and m, both inclusive) comprises first through n-th associative memory cells 105-j-1 through 105-j-n. Each of the associative memory words 104-j is connected to the corresponding data word line 106-j as input lines and to the corresponding data match line 107-j as output lines and to the first through the n-th bit lines 103 as data input/output lines.

Each of the associative memory cells 105-j-k (where k is and integer variable between 1 and n, both inclusive) is connected to the corresponding data word line 106-j as input lines, and to the corresponding data match line 107-j as output lines, and to the corresponding bit line 103-k as data input/output line. Each associative memory cell 105-j-k comprises a data cell 108-j-k, and a comparator 109-j-k. The data cell 108-j-k is for storing "data" bit information at a corresponding bit of second storage data. The comparator 109-j-k is for comparing the "data" bit information memorized in the data cell 108-j-k and "search" bit information at a corresponding bit of the arithmetic result 38 supplied through the bit line 103-k. When the bit information stored in the mask cell 9-j-k of the associative memory word 43-j of the associative memory 33 with an arithmetic result producing function is in a valid state for mask information, an invalid state for storage data is stored in the corresponding data cell 108-j-k. Otherwise, the same state in the corresponding data cell 8-j-k of the associative memory 33 with an arithmetic result producing function is stored in the data cell 108-j-k.

Each of the bit lines103, the data word 106, the data cell 108, and the data match line 107 in the associative memory cells 105-1-1 through 105-m-n is similar to the corresponding component in the conventional associative memory 116.

Prior to the start of the searching operation, the data match line 107 is precharged to a high level or pulled up by a resistor (not shown) to be put into a valid state "1".

The comparator 109 compares the state on the corresponding bit line 103 and the second storage data stored in the data cell 108 in the same associative memory cell 105. Upon coincidence, the comparator 109 puts the corresponding data match line 107 into an opened state. Upon incoincidence, the comparator 109 supplies an invalid state "0" to the corresponding data match line 107. Thus, the wired AND logic connection is achieved such that, when all of the comparator 109, n in number, in the associative memory word 104 render the data match line 107 in an opened state, the data match line 107 is put into a valid state "1" and otherwise into an invalid state "0". In other words, upon the searching operation, only when all of the second storage data stored in an associative memory word 104 is completely coincident with the bit lines 103-1 through 103-n, the data match line 107 is put into a valid state "1" and otherwise into an invalid state "0". Alternatively, an ordinary logical gate may be used as far as the similar operation is performed.

Figure 11:
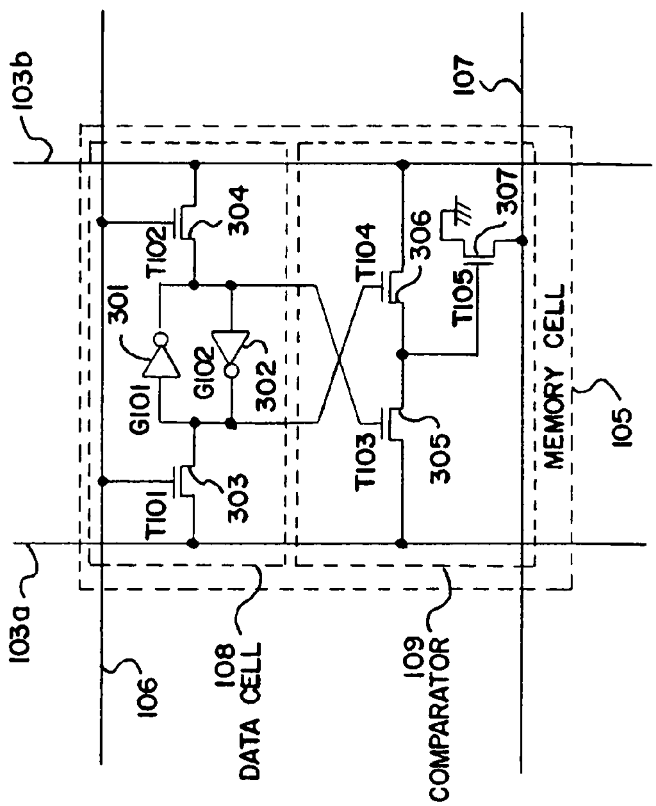
FIG. 11 is a circuit diagram of an associative memory cell illustrated in FIG. 10.

Next, referring to FIG. 11, each of the bit line 103*a* and 103*b*, the data word line 106, and the data cell 108 in the associative memory cell 105 of the associative memory 101 without mask function is similar to the corresponding component in the conventional associative memory cell 118. Therefore, description will be directed only to components different from the conventional associative memory cell 118.

The comparator 109 comprises a MOS transistor (T103) 305, a MOS transistor (T104) 306, and a MOS transistor (T105) 307. The comparator 109 is similar to the comparator 113 in the conventional associative memory cell 118 except eliminating the MOS transistor (T106) 308 from the transistors connected between a low potential and the data match line 107 in cascade, and connecting to the data match line 107 through the MOS transistors (T105) 307.

Therefore, when the second storage data stored in the data cell 108 and the search data 102 on the bit lines 103*a* and 103*b* are different from each other, the MOS transistor (T105) 307 is rendered conductive to supply the data match line 107 with an invalid state "0". Otherwise, the data match line 107 is put into an opened state.

Figure 12:
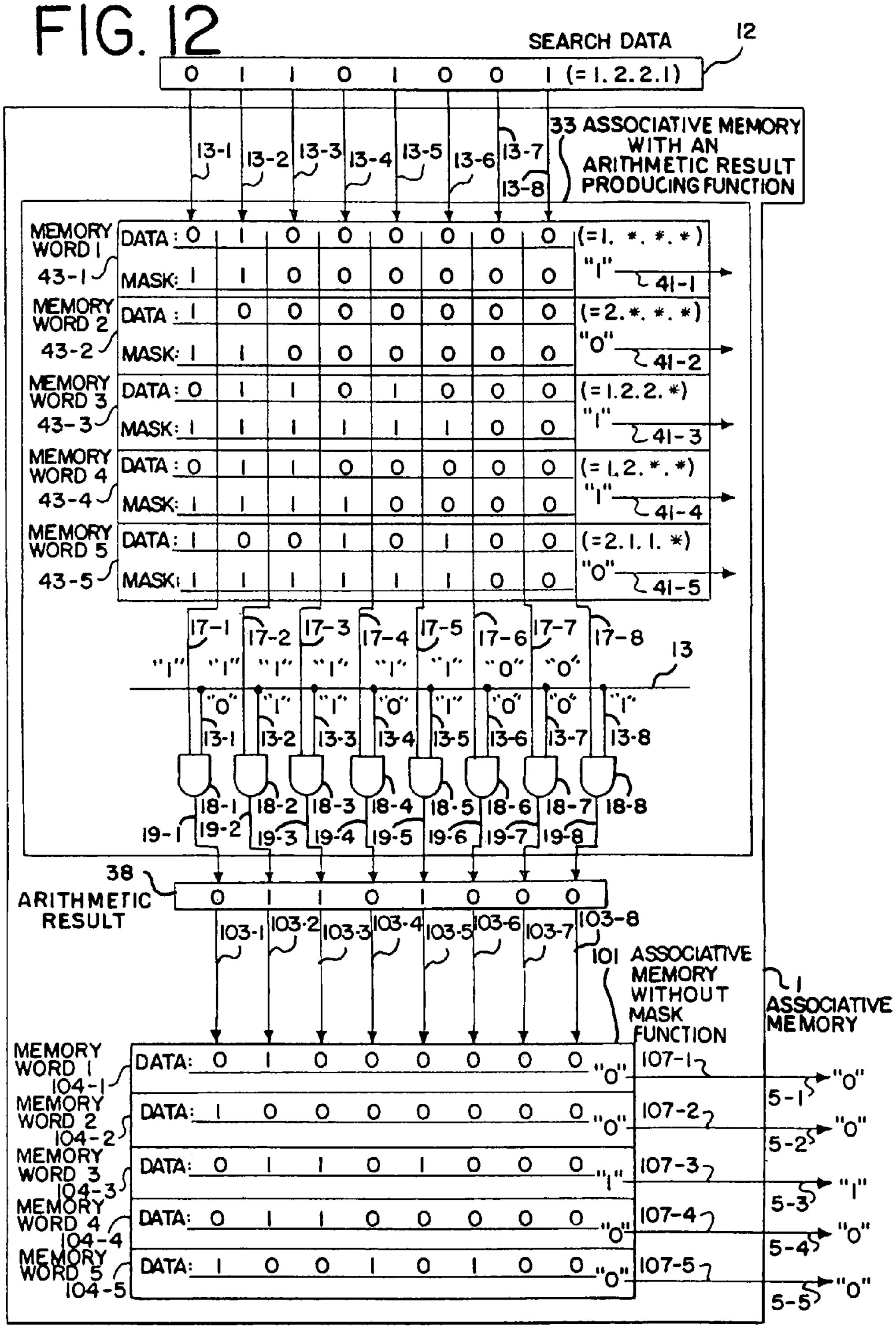
FIG. 12 is a view for describing an operation of the associative memory illustrated in FIG. 7.

Next referring to FIG. 12, description will be made about the operation when the above-mentioned associative memory 42 is used in calculating the transfer network address in the router 400-3 in FIG. 18. It is assumed here that the associative memory 42 comprises five words of eight bits. The associative memory 33 with an arithmetic result producing function memorizes the connection information in the associative memory words 43-1 through 43-5 except the network address (3, *, *, *) of the router 400-3 in FIG. 18. Herein, when a digit of a network address is represented by the symbol "*" as "don't care", the corresponding bit of the mask information is stored with a valid state "0" for the mask information, and the corresponding bit of the storage data is stored with an invalid state "0" for the storage data.

Specifically, the associative memory word 43-1 stores in binary numbers the storage data (01, 00, 00, 00) and the mask information (11, 00, 00, 00) to implement (1, *, *, *). Likewise, the associative memory word 43-2 stores in binary numbers the storage data (10, 00, 00, 00) and the mask information (11, 00, 00, 00) to implement (2, *, *, *). The associative memory word 43-3 stores in binary numbers the storage data (01, 10, 01, 00) and the mask information (11, 11, 11, 00) to implement (1, 2, 2, *). The associative memory word 43-4 stores in binary numbers the storage data (01, 10, 00, 00) and the mask information (11, 11, 00, 00) to implement (1, 2, *, *). The associative memory word 43-5 stores in binary numbers the storage data (10, 01, 01, 00) and the mask information (11, 11, 11, 00) to implement (2, 1, 1, *), The associative memory 101 without mask function memorizes the value which changed a digit of a network address is represented by the symbol "*" as "don't care" in the connection information of the router 400-3 in FIG. 18 into an invalid value "0" for the storage data, in the associative memory words 104-1 through 104-5 as the second storage data. Specifically, the associative memory word 43-1, 43-2, 43-3, 43-4, and 43-5 stores in binary numbers the second storage data (01, 00, 00, 00), (10, 00, 00, 00), (01, 10, 10, 00), (01, 10, 00, 00), and (01, 01, 01, 00), respectively.

Description will proceed to the searching operation by supplying as the search data 12 the network address (1, 2, 2, 1), in quadridecimal numbers, of the user's terminal (PC) 401-1 in FIG. 18.

At first, prior to the start of the searching operation, all of the intermediate match lines 41-1 through 41-5 and the data match lines 107-1 through 107-5 are precharged to a high level or pulled up by a resistor (not shown) to be put into a valid state "1".

When the search data 12 is supplied to the bit lines 13-1 through 13-9, the quadridecimal notations (1, *, *, *), (1, 2, 2, *) and (1, 2, *, *) respectively stored in the associative memory words 43-1, 43-3 and 43-4 in the associative memory 33 with an arithmetic result producing function are coincident with the search data 12 on the bit lines 13-1 through 13-8. Accordingly, the intermediate match lines 41-1, 41-3 and 41-4 are put into a valid state "1" while the remaining match lines 41-2, and 41-5 are put into an invalid state "0".

Herein, the matched mask logical-AND line 17-1 produces the logical multiplication "1", with "0" as true, of the mask bit data "1", "1" and "1" in the memory words 43-1, 43-3 and 43-4 at bit positions corresponding to the matched mask intermediate logic line 14-1. The matched mask logical-AND line 17-2 produces the logical multiplication "1", with "0" as true, of the mask bit data "1", "1" and "1" in the memory words 43-1, 43-3 and 43-4 at bit positions corresponding to the matched mask intermediate logic line 14-2. Likewise, the matched mask logical-AND lines 17-3, 17-4, 17-5, 17-6, 17-7, and 17-8 produce the logical multiplication "1" of "0", "1" and "1", the logical multiplication "1" of "0", "1" and "1", the logical multiplication "1" of "0", "1" and "0", the logical multiplication "1" of "0", "1" and "0", the logical multiplication "0" of "0", "0" and "0", and the logical multiplication "0" of "0", "0" and "0", respectively, with "0" as true. As a result, the binary notation "01101000" is delivered to the matched mask logical-AND lines 17-1 through 17-8. Each of the logical gates 18-1 through 18-8 is provided with both status of the corresponding bit positions of "11111100" as the value of the matched mask logical-AND line 17-1 through 17-8, and "01101001" as the value of the search data 12 supplied to the bit line 13-1 through 13-8. Then, as mentioned above, the logical gates 18-1 through 18-8 also supplies "01101000" as the result of the logical multiplication to the arithmetic result output line 19-1 through 19-8 as the arithmetic result 38, with "1" as true.

The arithmetic result 38 is supplied to the bit lines 103-1 through 103-8 in the associative memory 101 without mask function. Thereafter, the associative memory 101 without mask function starts a second searching operation. In this example of the operation, the second storage data stored in the associative memory word 104-3 is completely coincident with the states "01101000" on the bit lines 103-1 through 103-8 so that the corresponding data match line 107-3 is put into an opened state.

Since the second storage data stored in any other associative memory words 104-1, 104-2, 104-4 and 104-5 is not coincident, the corresponding data match lines 107-1, 107-2, 107-4, and 107-5 are supplied with an invalid state "0". Thus, in the data match line 107-1 through 107-5, the only data match line 107-3 can maintain a valid state "1" upon completion of the second searching operation. The state of the data match line 107-1 through 107-5 is supplied outside as match lines 5-1 through 5-5 so that the only match line 5-3 can maintain a valid state "1" upon completion of the second searching operation.

It will therefore be understood that, in the match lines 5 corresponding to one of the storage data coincident with the search data 12 taking the mask information into account, the only match line 5-3 corresponding to the storage data with the least number of bits in a mask valid state is put into a valid state. As described above, by the use of the associative memory of the third embodiment, it is possible to select in a single clock the particular word having the shortest mask information. Herein, as readily understood, it is possible to realize pipeline processing by inserting memory means between the bit lines 103-1 through 103-n and the arithmetic result output lines 19-1 through 19-n such that, the associative memory 33 with an arithmetic result producing function can carry out the first searching operation with the next search data 12 at the same time when the associative memory 101 without mask function carries out the second searching operation with the arithmetic result 38 stored in the memory means. The position where memory means are inserted may not be limited to an above-mentioned position.

Figure 13:
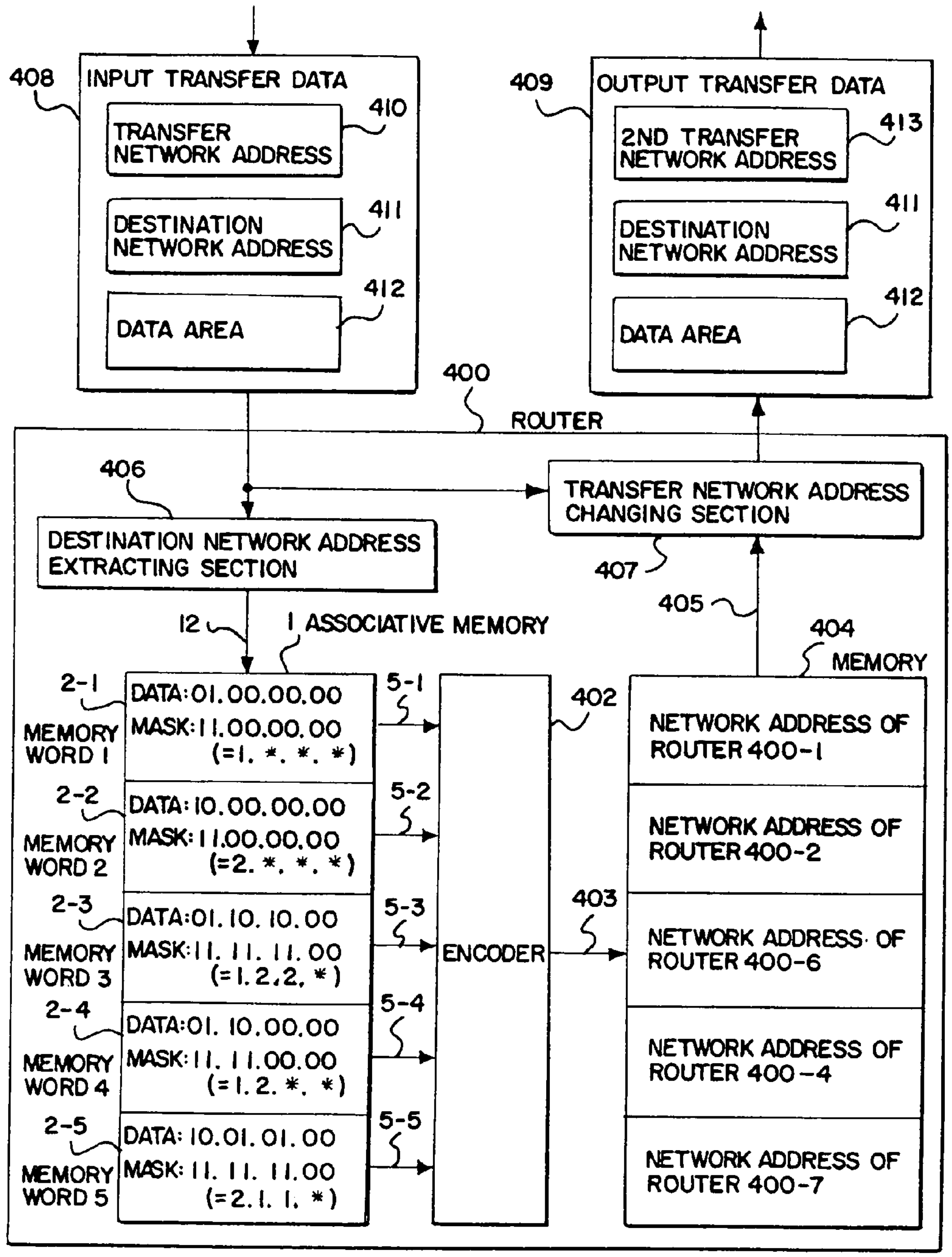
FIG. 13 is a block diagram of a router using the associative memory of this invention.
Figure 14:
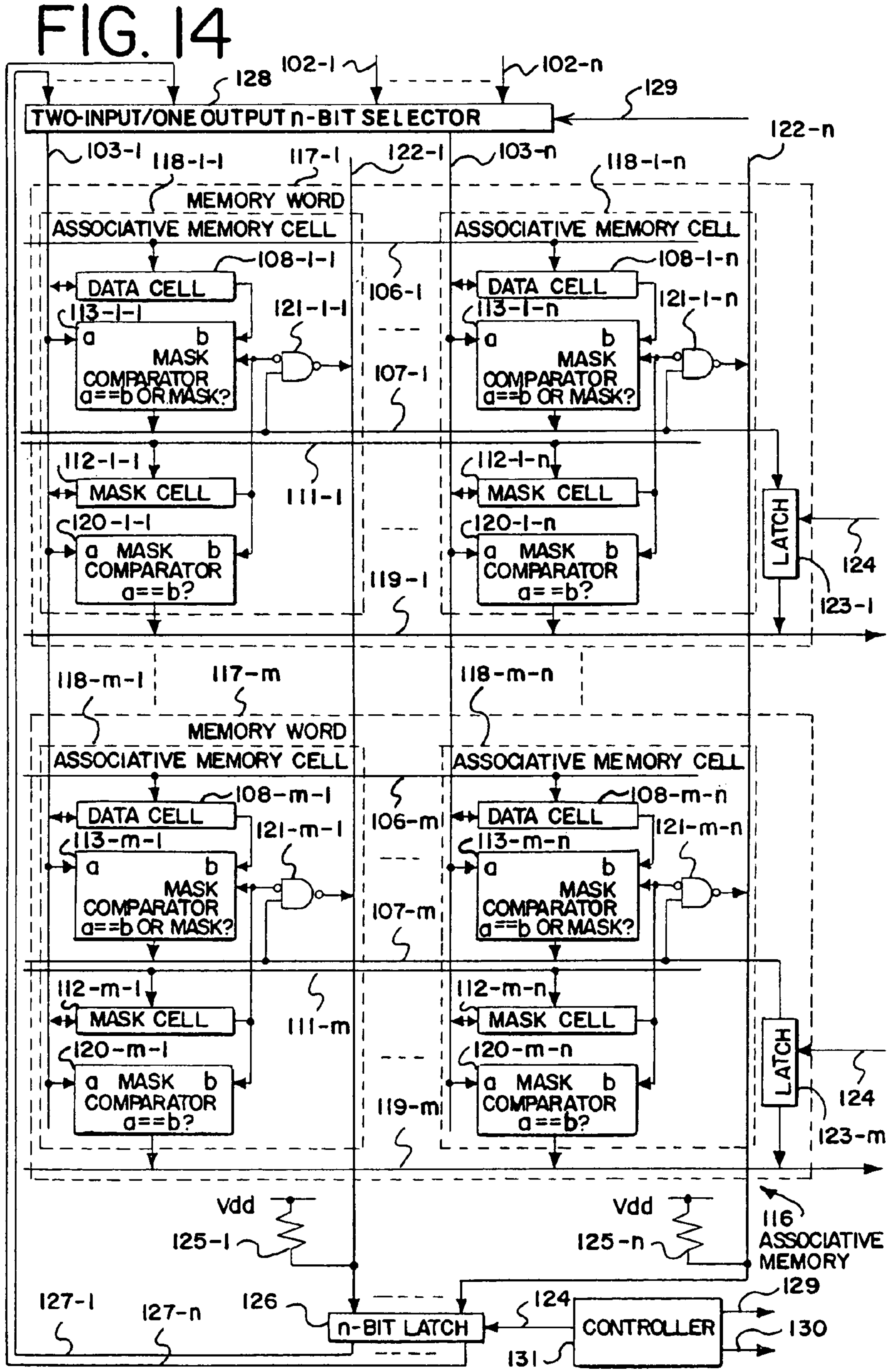
FIG. 14 is a block diagram of a conventional associative memory.

Next referring to FIG. 13, the associative memory 1 of the first embodiment is used in the router to calculate the transfer network address. The router 400 is supplied with input transfer data 408 and produces output transfer data 409. The input transfer data 408 comprise a destination network address 411, a transfer network address 410, and a data area 412. The output transfer data 409 comprise the destination network address 411, a second transfer network address 413, and the data area 412.

Figure 19:
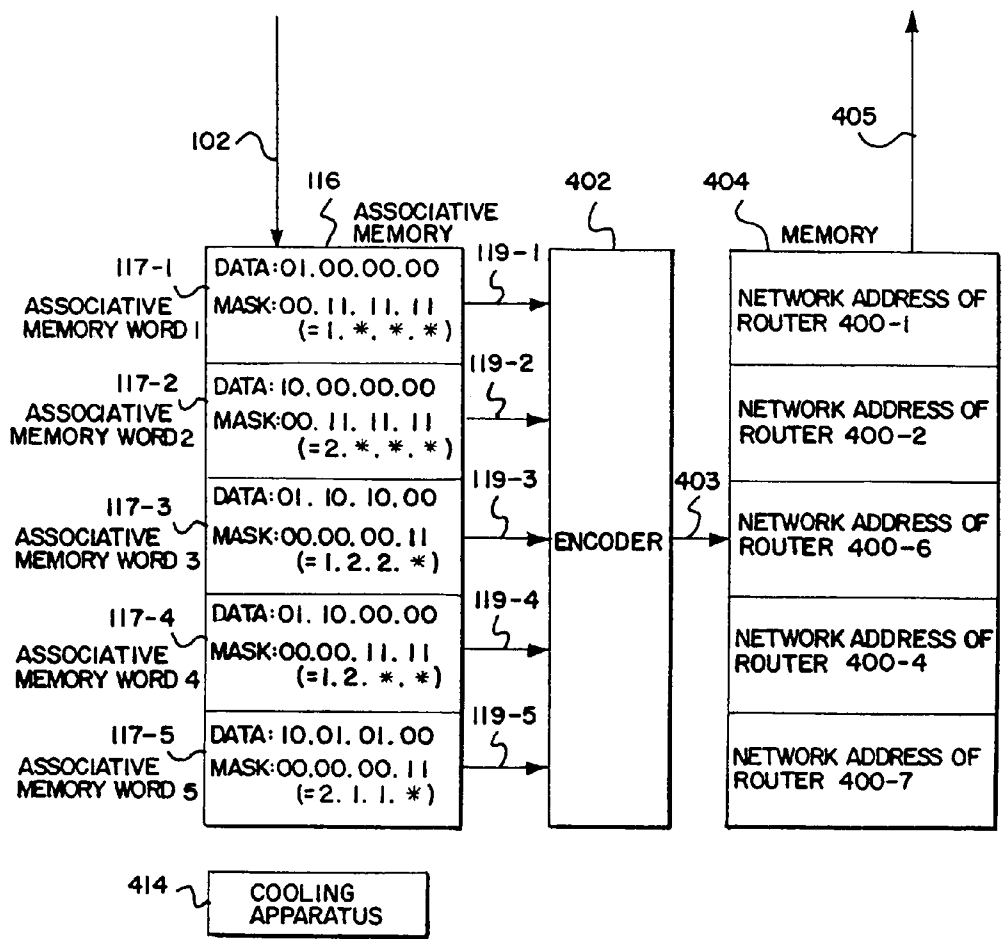
FIG. 19 shows a router using the conventional associative memory.

As will readily be understood, the transfer network address 410 in the input transfer data 408 is the network address of the router 400 itself. The router 400 comprises a destination network address extracting section 406, the associative memory 1, and encoder 402, a memory 404, and a transfer network address changing section 407. The cooling apparatus 414 is unnecessary to the router using the associative memory of this invention although the conventional router in FIG. 19 needs the cooling apparatus because of its large power consumption.

Herein, description will be made about the case where the associative memory is applied to the router 400-3 in FIG. 18. It is assumed that the input data are transferred from an apparatus having a network address **(3, *, *, *) to another apparatus having a network address (1, *, *, *) or (2, *, *, *). In FIG. 13, a valid state and an invalid state are represented by "1" and "0", respectively, for both of the stored data and the match lines 5-1 through 5-5**. A valid state and an invalid state are represented by "0" and "1", respectively, for the mask information.

The destination network address extracting section 406 extracts the destination network address 411 contained in the input transfer data 408 and supplies the destination network address 411 to the associative memory 1 as the search data 12.

The associative memory 1 memorizes the connection information except the network address **(3, *, *, *) of the router 400-3** itself. Herein, when a digit of a network address is represented by the symbol "*" as "don't care", the corresponding bit of the storage data is stored with an invalid state "0" for the storage data, and the corresponding bit of the mask information is stored with a valid state "0" for the mask information. Specifically, the associative memory word 2-1 stores in binary numbers the storage data (01, 00, 00, 00) and the mask information (11, 00, 00, 00) to implement **(1, *, *, *)**.

Likewise, the associative memory word 2-2 stores in binary numbers the storage data (10, 00, 00, 00) and the mask information (11, 00, 00, 00) to implement **(2, *, *, *). The associative memory word 2-3 stores in binary numbers the storage data (01, 10, 01, 00) and the mask information (11, 11, 11, 00) to implement (1, 2, 2, *). The associative memory word 2-4 stores in binary numbers the storage data (01, 10, 00, 00) and the mask information (11, 11, 00, 00) to implement (1, 2, *, *). The associative memory word 2-5 stores in binary numbers the storage data (10, 01, 01, 00) and the mask information (11, 11, 11, 00) to implement (2, 1, 1, *)**.

The match lines 5-1 through 5-5 corresponding to the associative memory words 2-1 through 2-5 are supplied to the encoder 402. The encoder 402 encodes the match lines 5-1 through 5-5 and delivers the encoded result to the memory 404 as the memory address signal 403.

In the memory 404, the network address of the router corresponding to the network address formed by the storage data and the mask information of each associative memory word 2-1 through 2-5 in the associative memory 1 is stored in each corresponding word. For example, the first associative memory word 2-1 of the associative memory 1 stores the network address **(1, *, *, *). The network address of the router 400-1 corresponding thereto is stored in the first word of the memory 404. In the memory 404, the network address of the router corresponding to the network address formed by the storage data and the mask information of each associative memory word 2-1 through 2-5 in the associative memory 1 is stored in each corresponding word. For example, the first associative memory word 2-1 of the associative memory 1 stores the network address (1, *, *, *). The network address of the router 400-1 corresponding thereto is stored in the first word of the memory 404. The transfer network address changing section 407 changing the transfer network address 410 in the input transfer data 408 into the values of the memory data signal 405 as the second transfer network address 413 in the output transfer data 409. Then, the output transfer data 409 is transferred to a network apparatus corresponding to the second transfer network address 410**.

It is assumed that the destination network address 411 in the input transfer data 408 is (1, 2, 2, 1). Upon completion of the searching operation in the associative memory 1, the match line 5-3 corresponding to the network address **(1, 2, 2, *) in the third associative memory word 5-3 alone is put into a valid state. Then, the encoder 402 produces "3" as the memory address 403. The memory 404 produces the memory data signal 405 representative of the network address of the router 400-6. The transfer network address changing section 407 changes the transfer network address 410 in the input transfer data 408 into the network address of the router 400-6 as the second transfer network address 413 in the output transfer data 409. Thus, the output transfer data 409 are delivered to the router 400-6**.

As mentioned above, the router of this invention using the associative memory 1 to calculate the transfer network address can cut down the product cost since the cooling apparatus 414 is unnecessary.

The router of this invention can reduce the number of the associative memory 1 in the router 400 since the storage capacity per chip increases. Therefore, the computer network system using the router 400 of this invention can accelerate the data transfer rate, since the computer network system using the router 400 of this invention does not require comparing to the results of the searching operation supplied from a plurality of the associative memory.

As described above, the associative memory 1 has means that carries out both the first searching operation comparing the storage data with the search data taking the mask information into account and the second searching operation comparing the value of the above-mentioned storage data with the value calculated using the result of the first searching operation using the same comparators, and supplies the result of both the first search operation and the second search operation to the same match lines. Therefore, the associative memory can reduce the circuit area of transistors that compose a unit cell which stores one bit, by about 25% in comparison with the conventional associative memory. In other words, storage capacity per unit of chip area can increase by about 33%. Since the reduction in the circuit area accompanies with the reduction in the parasitic capacitances, the frequency of the clock signal can be made higher about 32%, compared with the conventional associative memory.

In the case of the same number of words, the associative memory of this invention can reduce the power consumption by about 50% in comparison with the conventional associative memory.

Further, if the associative memory of this invention is incorporated into the router for calculating the network address, the product cost can be reduced because the cooling apparatus is unnecessary.

As will be understood from the foregoing, the network system using the router of this invention can accelerate the data transfer rate, because operation frequency can be made higher and the computer network system using the router of this invention does not require comparing to the results of the searching operation supplied from a plurality of the associative memory by reducing the number of the associative memory incorporated therein.

What is claimed is:

1. An associative memory which stores a mask information therein corresponding to each single or each plural words of storage data, the mask information enabling to set in accordance with a valid state or an invalid state whether or not each single bit or each plural bits of the storage data is excluded from a search object, said associative memory comprising:

- a first circuit means for conducting a primary search operation for each single word of the storage data so as to exclude a single or plural bits of the storage data from the search object with use of an external search data input to the memory when the mask information corresponding to each single word is in a valid state;
- a second circuit means for selecting a single or plural words as a candidate data;
- a third circuit means for conducting a logical AND operation to obtain a matched mask logical AND information between each mask information corresponding to the selected candidate data, with assuming the valid state of the mask information as true; and
- a fourth circuit means for conducting a first logical operation between the matched mask logical AND information and the search data.

2. The associative memory as set forth in claim 1, wherein said associative memory further comprises a fifth circuit means for storing a particular bit pattern as the storage data in the single bit or the plural bits excluded in the primary search operation in accordance with a mask information corresponding thereto, and a sixth circuit means for conducting a secondary search operation to select a word in which the storage data matches with a result of the first logical operation.

3. The associative memory as set forth in claim 2, wherein said associative memory further comprises a seventh circuit means for conducting a further secondary search operation to convert the result of the first logical operation into the search data thereby selecting a word which matches the result of the first logical operation, with regarding the single bit or the plural bits of the storage data excluded from the search object in the primary search operation as the particular bit pattern.

4. The associative memory as set forth in claim 2, wherein each bit of the particular bit pattern is constructed in an invalid state for the storage data.

5. The associative memory as set forth in claim 1, wherein the first logical operation is conducted in a manner that information of the same bit position of the search data is set as the result of the logical operation at the same bit position when a bit for the matched mask logical AND information is an invalid state for the mask information or that an invalid state for the storage data is set as the result of the logical operation at the same bit position when a bit for the matched mask logical AND information is a valid state for the mask information.

6. An associative memory which stores a mask information therein corresponding to each single or each plural words of storage data, the mask information enabling to set in accordance with a valid state or an invalid state whether or not each single bit or each plural bits of the storage data is excluded from a search object, said associative memory comprising a first associative sub-memory and a second associative sub-memory, said first associative sub-memory comprising:

- a first circuit means for conducting a primary search operation for each single word of the storage data so as to exclude a single or plural bits of the storage data from the search object with use of an external search data input to the memory when the mask information corresponding to each single word is in a valid state;
- a second circuit means for selecting a single or plural words as a candidate data;
- a third circuit means for conducting a logical AND operation to obtain a matched mask logical AND information between each mask information corresponding to the selected candidate data, with assuming the valid state of the mask information as true; and a fourth circuit means for conducting a first logical operation between the matched mask logical AND information and the search data, said second associative sub-memory storing the same storage data in each word corresponding to addresses of each word of said first associative sub-memory, wherein the primary search operation is performed in a manner that the external search data is input to said first associative sub-memory to obtain a result of logical operation and a secondary search operation is performed in a manner that the result of logical operation is input to said second associative sub-memory as a search data to select a word in which a bit information of the storage data matches with the result of logical operation.

7. The associative memory as set forth in claim 6, wherein said associative memory further comprises one or more memory means for storing the result of logical operation output from said first associative sub-memory so that the primary search operation and the secondary search operation can be performed in parallel with use of an output of the one or more memory means.

8. An associative memory which stores a mask information therein corresponding to each single or each plural words of storage data, the mask information enabling to set in accordance with a valid state or an invalid state whether or not each single bit or each plural bits of the storage data is excluded from a search object, said associative memory comprising a first searching means and a second searching means, said first searching means comprising:

a first circuit means for conducting a primary search operation for each single word of the storage data so as to exclude a single or plural bits of the storage data from the search object with use of an external search data input to the memory when the mask information corresponding to each single word is in a valid state;

a second circuit means for generating an intermediate information in a manner to select a mask information having a minimum bit number in a storage information set to be excluded from the search object among all the mask information which corresponds to the storage data matching with the search data when one or more storage data match with the search data; and a third circuit means for outputting to an arithmetic result output line the result of a first logical operation between the intermediate information and a search information, said second searching means outputting to the arithmetic result output line a signal to identify the matched storage data.

9. The associative memory as set forth in claim 8, wherein said first searching means stores a particular bit pattern as the storage data in the single bit or the plural bits excluded in the primary search operation in accordance with a mask information corresponding thereto.

10. The associative memory as set forth in claim 9, wherein said second searching means conducts a search with regarding the storage data in the single bit or the plural bits excluded in the primary search operation in accordance with a mask information corresponding thereto as a particular bit pattern, and selects a word in which the storage data matches with data of the arithmetic result output line.

11. The associative memory as set forth in claim 9, wherein each bit of the particular bit pattern is constructed in an invalid state for the storage data.

12. The associative memory as set forth in claim 8, wherein said first searching means comprises an arithmetic result output circuit having a match line revealing a valid state when the search data matches with the storage data accompanying the mask information for each word of the storage data, means for generating an intermediate information in a manner that when one or more storage data matches with the search data, a logical AND operation is performed for all the mask information corresponding to a matched storage data, with assuming the valid state of the mask information as true, and means for outputting to the same bit position of the arithmetic result output line as a result of operation information of the same bit position of the search data when a bit of the intermediate information is an invalid state or information of invalid state when a bit of intermediate information is a valid state.

13. The associative memory as set forth in claim 8, wherein said first searching means comprises:

a first memory means for storing information of the arithmetic result output line;

a selecting means for selecting and inputting as input search data either the external search data or an output signal of the first memory means; and a comparing means for outputting to the corresponding match line comparison result in a manner that when the output signal of the first memory means is selected as the search data, comparison is made between the search data and the storage data while invalidating a function for excluding a single bit or plural bits of the storage data when the corresponding mask information is valid, thereby sharing each constituent element between said first and second searching means.

14. The associative memory as set forth in claim 8, wherein said first searching means comprises:

a first memory means for storing information of the arithmetic result output line;

a selecting means for selecting and inputting as input search data either the external search data or an output signal of the first memory means; and a comparing means for outputting to the corresponding match line comparison result in a manner that when the output signal of the first memory means is selected as the search data, comparison is made between the search data and the storage data while regarding a single bit or plural bits of the storage data when the corresponding mask information is valid as an invalid state for the storage data, thereby sharing each constituent element between said first and second searching means.

15. A router for storing routing information therein having an associative memory which stores a mask information therein corresponding to each single or each plural words of storage data, the mask information enabling to set in accordance with a valid state or an invalid state whether or not each single bit or each plural bits of the storage data is excluded from a search object, said router comprising:

a first searching means for outputting to an arithmetic result output line the result of a first logical operation between a matched mask logical AND information and a search data in a manner that a primary search operation for excluding a single bit or plural bits for each word of the storage data corresponding to a mask information from the search object when the mask information is valid is performed wherein a destination network address of input transfer data is selected as the search data, and the matched mask logical AND information is generated in such a manner to conduct a logical AND operation between each mask information corresponding to the storage data which matches with the destination network address with assuming the valid state of the mask information as true;

a second searching means for outputting a match signal to identify the routing information having the storage data matching with information of the arithmetic result output line; and means for determining a transfer address of the input transfer data in response to the match signal.

16. A router for storing a plurality of routing information in a routing information table which stores a mask information therein corresponding to each single or each plural words of storage data, the mask information enabling to set in accordance with a valid state or an invalid state whether or not each single bit or each plural bits of the storage data is excluded from a search object, said router comprising:

means for generating an arithmetic result output signal as a result of a first logical operation between a matched mask logical AND information and a search data in a manner that a primary search operation for excluding a single bit or plural bits for each word of the storage data corresponding to a mask information from the search object when the mask information is valid is performed wherein a destination network address of input transfer data is selected as the search data, and the matched mask logical AND information is generated in such a manner to conduct a logical AND operation between each mask information corresponding to the storage data which matches with the destination network address with assuming the valid state of the mask information as true;

means for outputting a match signal to identify the routing information having the storage data matching with information of the arithmetic result output line; and means for determining a transfer address of the input transfer data in response to the match signal.

17. A network system for communicating data between devices connected to a network through the router as set forth in claim 15.

18. A network system for communicating data between devices connected to a network through the router as set forth in claim 16.

* * * * *